(12) United States Patent
McCorquodale et al.

(10) Patent No.: US 6,972,635 B2
(45) Date of Patent: Dec. 6, 2005

(54) MEMS-BASED, COMPUTER SYSTEMS, CLOCK GENERATION AND OSCILLATOR CIRCUITS AND LC-TANK APPARATUS FOR USE THEREIN

(75) Inventors: Michael S. McCorquodale, Ann Arbor, MI (US); Richard B. Brown, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/374,446

(22) Filed: Feb. 26, 2003

(65) Prior Publication Data
US 2003/0210101 A1 Nov. 13, 2003

Related U.S. Application Data
(60) Provisional application No. 60/360,314, filed on Feb. 26, 2002.

(51) Int. Cl.[7] ................................................. H03B 5/08
(52) U.S. Cl. ..................... 331/167; 331/177 R; 331/74; 331/36 C; 331/177 V; 331/117 R; 331/117 FE
(58) Field of Search ............................... 331/177 R, 74, 331/167, 117 R, 117 FE, 177 V, 108 C, 36 C; 333/262

(56) References Cited

U.S. PATENT DOCUMENTS

| | | | |
|---|---|---|---|
| 5,959,516 A | | 9/1999 | Chang et al. |
| 6,049,702 A | * | 4/2000 | Tham et al. ................... 455/78 |
| 6,215,644 B1 | | 4/2001 | Dhuler |
| 6,232,847 B1 | * | 5/2001 | Marcy et al. ............... 331/167 |
| 6,242,989 B1 | | 6/2001 | Barber et al. |
| 6,292,065 B1 | * | 9/2001 | Friedman et al. ....... 331/117 R |
| 6,539,253 B2 | * | 3/2003 | Thompson et al. ............ 607/2 |
| 2001/0016367 A1 | | 8/2001 | Ziegler |
| 2002/0021054 A1 | | 2/2002 | Nguyen |
| 2003/0020565 A1 | | 1/2003 | Cornett et al. |
| 2003/0034535 A1 | | 2/2003 | Barenburg et al. |

FOREIGN PATENT DOCUMENTS

WO        WO 02/16256         2/2002

OTHER PUBLICATIONS

Svelto, Francesco., et al., A 1.3 Ghz Low–Phase Noise Fully Tunable CMOS LC VCO, IEEE Journal of Solid–State Circuits, vol. 35, No. 3, pp. 356–361, Mar. 2000.

Zohios, Jerasimos, et al., A Fully Integrated 1 Ghz BiCMOS VCO. Proceedings of the 6th IEEE International Conference on Electronics, Circuits and Systems, vol. 1, pp. 193–196, 1999.

Young, Darrin J., et al., A Low–Noise RF Voltage–Controlled Oscillator Using On–Chip High–Q Three Dimensional Coil Inductor and Miromachined Variable Capacitor, Solid–State Sensor and Actuator Workshop, pp. 128–131, 1998.

(Continued)

Primary Examiner—Arnold Kinkead
(74) Attorney, Agent, or Firm—Brppks Kushman P.C.

(57) ABSTRACT

MEMS-based, computer system, clock generation and oscillator circuits and LC-tank apparatus for use therein are provided and which are fabricated using a CMOS-compatible process. A micromachined inductor (L) and a pair of varactors (C) are developed in metal layers on a silicon substrate to realize the high quality factor LC-tank apparatus. This micromachined LC-tank apparatus is incorporated with CMOS transistor circuitry in order to realize a digital, tunable, low phase jitter, and low power clock, or time base, for synchronous integrated circuits. The synthesized clock signal can be divided down with digital circuitry from several GHz to tens of MHz—a systemic approach that substantially improves stability as compared to the state of the art. Advanced circuit design techniques have been utilized to minimize power consumption and mitigate transistor flicker noise upconversion, thus enhancing clock stability.

61 Claims, 9 Drawing Sheets

OTHER PUBLICATIONS

Roessig, T.A., et al., Surface–Micromachined 1MHz Oscillator with Low–Noise Pierce Configuration, Solid–State Sensor and Actuator Workshop, 1998.

Craninckx, Jan, et al., A 1.8–Ghz CMOS Low–Phase–Noise Voltage–Controlled Oscillator with Prescaler, IEEE Journal of Solid–State Circuits, vol. 30, No. 12, pp. 1474–1482, Dec. 1995.

Craninckx, Jan. et al., A 1.8–Ghz Low–Phase–Noise CMOS VCO Using Optimized Hollow Spiral Inductors, IEEE Journal of Solid–State Circuits, vol. 32, No. 5, pp. 736–744, May 1997.

Young, Darrin J., et al., A Micromachine–Based RF Low–Noise Voltage–Controlled Oscillator, IEEE Custom Integrated Circuits Conference, pp. 431–434, 1997.

Niu, Feng, et al., MEMS Structures For Pervasive Device Applications, 2001 IEEE International Conference On Systems, Man And Cybernetics. E–Systems And E–Man For Cybernetics In Cyberspace, Proceedings of IEEE International Conference On Systems, Man & Cybernetics, Tuscon, AZ, pp. 7–10, Oct. 2001.

Fedder, G.K., et al., Laminated High–Aspect–Ratio Microstructures In A Conventional CMOS Process, Proceedings, IEEE, The Ninth Annual International Workshop On Micro Electro Mechanical Systems. An Investigation of Micro Structures, Sensors, Actuators, Machines And Systems, Proceedings of Ninth International Workshop on Micro E., pp. 13–18, New York, New York, 1996.

Yang, Lung–Jieh, et al., CMOS Microelectromechanical Bandpass Filters, Sensors And Actuators A (Physical), May 1, 2001, Elsevier, Switzerland, vol. A90, No. 1–2, pp. 148–152.

Park, Eun–Chul, et al., Fully Integrated Low Phase–Noise VCOs With On–Chip MEMS Inductors, IEEE Transactions On Microwave Theory And Techniques, vol. 51, No. 1, Jan. 2003.

Mohamed, Amal, et al., 1GHz CMOS VCO Design For Wireless Application, Using MEMS Technology, Design Test, Integration, And Packaging of MEMS/MOEMS, Paris, France, May 9–11 2000, vol. 4019, pp. 181–185, Proceedings of The SPIE—The International Society for Optical Engineering, 2000, SPEI–Int. Soc. Opt. Eng.

Ribas, R.P., et al., Micromachined Planar Spiral Inductor in Standard GaAs HEMT MMIC Technology, IEEE Electron Device Letters, vol. 19, No. 8, pp. 285–287, Aug. 2000.

Rogers, J.W., et al., A Completely Integrated 2GHz VCO with Post–Processed Cu inductors, IEEE Custom Integrated Circuits Conference, pp. 575–578, 2001.

Samori, C., et al., A Fully–Integrated Low–Power Low–Noise 2.6–Ghz Bipolar VCO for Wireless Applications, IEEE Microwave and Wireless Components Letters, vol. 11, No. 5, pp. 199–201, May 2001.

De Muer, Bram, et al., A 2–GHz Low–Phase Integrated LC–VCO Set with Flicker–Noise Upconversion Minimization, IEEE Journal of Solid–State Circuits, vol. 35, No. 7, pp. 1034–1038, Jul. 2000.

Novof, I., et al., Fully–Integrated CMOS Phase–Locked Loop with 15 to 240MHz Locking Range and ±50ps Jitter, Solid–State Circuits Conference, 1995. Digest of Technical Papers. $42^{nd}$ ISSCC, 1995 IEEE International, Feb. 15–17, 1995, pp. 112–113, 347.

Dec, Aleksander, et al., Microwave MEMS–Based Voltage–Controlled Oscillators, IEEE Transactions on Microwave Theory and Techniques, vol. 48, No. 11, Nov. 2000.

Klepser, Bernd–Ulrich H., et al., A Fully Integrated Sige Bipolar 2.4 GHZ Bluetooth Voltage–Controlled Oscillator, IEEE Radio Frequency Integrated Circuits Symposium, pp. 61–64, 2000.

Zannoth, M. et al., A Single–Chip Si–Bipolar 1.6 GHZ VCO with Integrated Bias Network, IEEE Transactions on Microwave Theory and Techniques, vol. 48, No. 2, pp. 203–205, Feb. 2000.

Harada, Mitsuru, et al., 2–Ghz RF Front–End Circuits in CMOS/SIMOX Operating at an Extremely Low Voltage of 0.5 V, IEEE Journal of Solid–State Circuits, vol. 35, No. 12, pp. 2000–2004, Dec. 2000.

Hung, C.–M., et al., A packaged 1.1–Ghz CMOS VCO with Phase Noise of—126 dBc/Hz at a 600–kHz Offset, IEEE Journal of Solid–State Circuits, vol. 35, No. 1, pp. 100–103, Jan. 20000.

Young, D., et al., A Micromachined–Based RF Low–Noise Voltage–Controlled Oscillator, IEEE Custom Integrated Circuits Conference, pp. 431–434, 1997.

Zou, J., et al., Development of a Wide Tuning Range MEMS Tunable Capacitor for Wireless Communcation Systems, International Electron Device Meeting, pp. 403–406, 2000.

Yao, J., et al., High Tuning Ratio MEMS Based Tunable Capacitors for RF Communications Applications, Solid–State Sensors and Actuators Workshop, pp. 124–127, 1998.

Yoon, J.–B., et al., A High–Q Tunable Micromechanical Capacitor with Moveable Dielectric for RF Applications, International Electron Devices Meeting, pp. 20.4.1–20.4.4, 2000.

Fan, L., et al., Universal MEMS Platforms for Passive RF Components: Suspended Inductors and Variable Capacitors, pp.29–33, 1998.

Yeh, J.–L., et al., Copper–Encapsulated Silicon Micromachined Structures, IEEE Journal of Microelectromechanical Systems, vol. 9, No. 3, pp. 281–287, Sep. 2000.

Yoon, J.–B., et al., Surface Micromachines Solenoid On–Si and On–Glass Inductors for RF Applications, IEEE Electron Device Letters, vol. 20, No. 9, pp. 487–489, Sep. 1999.

Rogers, J.W., et al., Post–Processed Cu Inductors with Application to a Completely Integrated 2–Ghz VCO, IEEE Transactions on Electron Devices, vol. 48, No. 6, pp. 1284–1287, Jun. 2001.

Young, Darrin J., et al., Monolithic High–Performance Three–Dimensional Coil Inductors for Wireless Communication Applications, International Electron Devices Meeting, pp. 3.5.I–3.5.4, 1997.

Hisamoto, D., et al., Silicon RF Device Fabricated by ULSI Processes Featuring 0.1–$\mu$m SOI–CMOS and Suspended Inductors, Symposium on VLSI Technology Digest of Technical Papers, pp. 104–105, 1996.

* cited by examiner

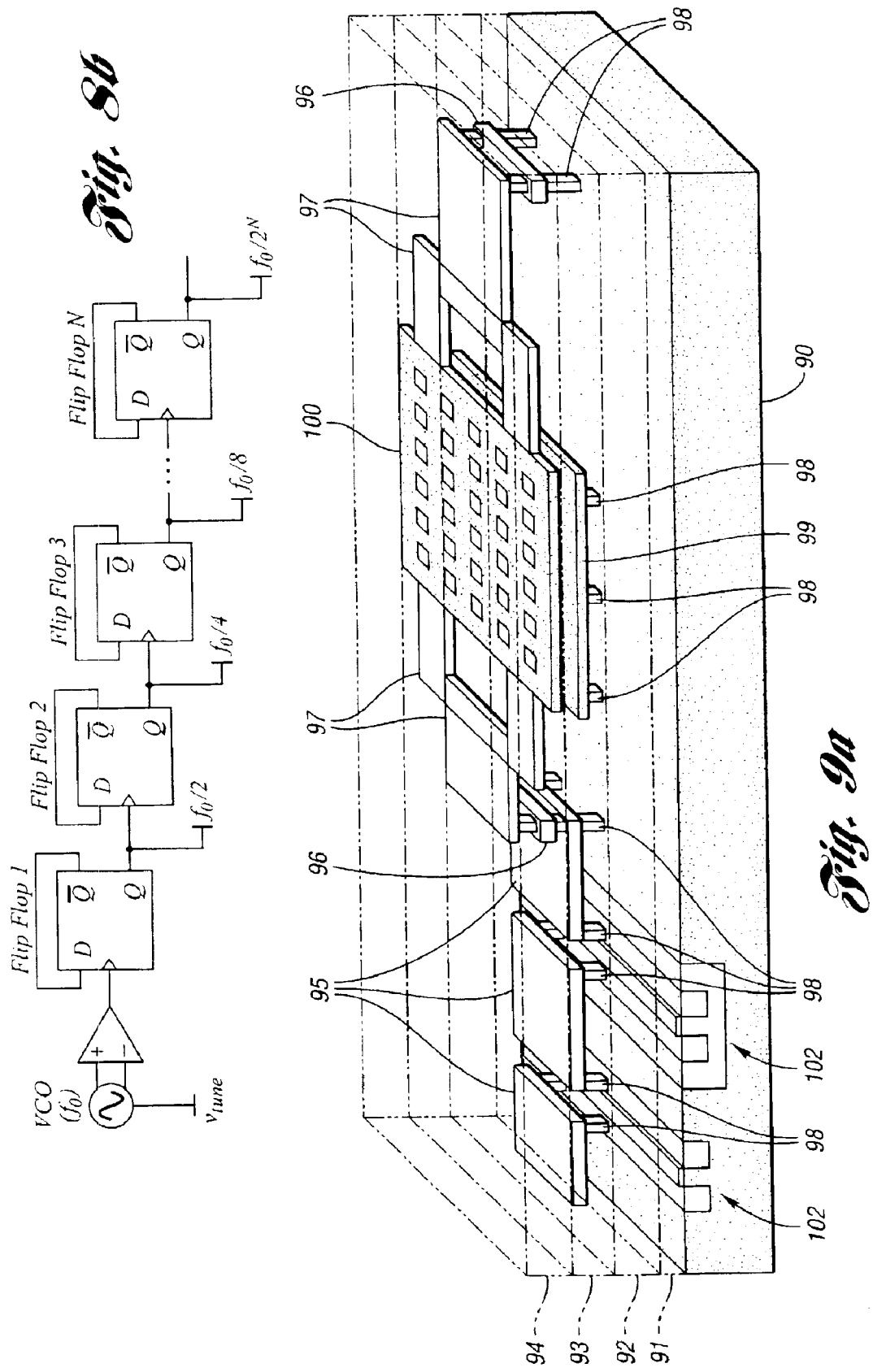

MEMS-BASED, COMPUTER SYSTEMS, CLOCK GENERATION AND OSCILLATOR CIRCUITS AND LC-TANK APPARATUS FOR USE THEREIN

CROSS-REFERENCE TO RELATED APPLICATION

This application claims the benefit of U.S. provisional application Ser. No. 60/360,314, filed Feb. 26, 2002 and entitled "Low-Phase Noise, Low Power, Monolithic, MEMS-Based Voltage Controlled Oscillator in Silicon-On-Insulator Technology."

BACKGROUND OF THE INVENTION

1. Field of the Invention

This invention relates to MEMS-based, computer systems, clock generation and oscillator circuits and LC-tank apparatus for use therein.

2. Background Art

Oscillators serve a variety of purposes in electronic systems and integrated circuits. For example, in RF systems, oscillators are typically used for frequency translation, via mixing, to and from low and high frequencies, or the baseband and passband, respectively. In mixed-signal circuits, such as switched capacitor circuits, a clock is required to open and close the switches within specific intervals. In microcontrollers, oscillators set the time base, or clock, of the system, which paces the execution of instructions in the core.

Currently clock and other periodic signals are synthesized with components apart, or off-chip, from the electronics they support. Current embodiments of periodic signal synthesis include a quartz crystal reference for an on-chip oscillator that drives a phase locked loop (PLL) or delay locked loop (DLL) which is utilized to generate the frequency, or frequencies, needed for the application. Quartz crystals are utilized as they provide a highly stable reference for frequency synthesis. However, the technology is incompatible with silicon integrated circuit technology. If clock synthesis could be performed on-chip, with no external components, significant reductions in power dissipation, size, and cost of electronic systems and integrated circuits could be realized. In fact, for some low-performance processors, the cost of the crystal reference itself can exceed the cost of the entire processor. Size reductions could be realized if the reference oscillator were integrated onto the processor die, and thus, the area allocated on the printed circuit board for a discrete reference would be eliminated. Moreover, a reduction in the pad count could be realized on the processor die as an interface to the reference electronics would no longer be required. Power dissipation could be reduced by as much as two orders of magnitude, dependent on clock frequency, because power hungry inter-chip transceivers would not be required. Lastly, with the use of a discrete clock reference comes the requirement of a PLL or DLL for frequency generation as crystal-based oscillators are fixed-frequency. These subsystems, though typically integrated, can add significantly to the overall power budget.

Despite the obvious and inherent advantages of integrated clock synthesis, the development of such technology has not gained much momentum. The challenges faced are many and include the inability to generate a stable clock signal on-chip due to unavailable or poor on-chip reference technology, temperature instability, and drift. Stability is the foremost factor limiting ubiquitous employment of monolithic clock references, since short term instability can cut into processor timing budgets and compromise performance.

Phase Noise and Jitter

Oscillators are designed to provide a stable output frequency that ideally does not deviate from some center frequency, typically referred to as $f_0$. In the frequency domain, this performance can be represented by a Dirac-Delta function at $f_0$. However, due to device noise such as flicker and thermal noise, as well as electromagnetic interference, oscillators will deviate from this center frequency. Thus, finite power exists in frequencies around the center frequency. Minimizing this phenomenon is highly desired since it can cause a variety of problems such as reciprocal mixing in RF systems and a reduction in the usable timing budget in microcontrollers.

Phase noise and jitter are metrics that quantify the frequency stability of a periodic signal. Phase noise defines the noise power spectrum around the fundamental frequency. Jitter metrics quantify the time domain uncertainty in the oscillator period. Ideally, edges of the oscillator signal occur at identical intervals in time. In practical circuits, the edges of the signal deviate from this ideal position in time by some amount each cycle.

The most significant contributing factor to phase noise performance is the quality-factor (Q) of the oscillator circuit. The quality factor is a measure of the loss in a given system, as described by (1):

$$Q = 2\pi \frac{W_s}{W_d} \quad (1)$$

Here, $W_s$ is the energy stored at resonance and $W_d$ is the energy dissipated per cycle. A more commonly used expression for the quality factor of electrical circuits is given by the following:

$$Q = \frac{f_o}{BW_{\_3\,dB}} \quad (2)$$

where $f_o$ is the resonant frequency and $BW_{\_3dB}$ is the 3 dB bandwidth of the magnitude response.

The relationship between quality factor and phase noise is quadratic, as shown in (3):

$$\left(\frac{N_o}{C}\right)_{fm} = \frac{FkT}{C} \frac{1}{8Q^2}\left(\frac{f_o}{f_m}\right)^2 \quad (3)$$

Here, $$\frac{N_o}{C}$$

is the phase noise density at offset $f_m$ from $f_o$, F is the noise factor of the circuit, k is Boltzmans's constant, T is temperature, C is the output power, and $f_o$ is the nominal output frequency. Clearly, by developing an oscillator with a high Q-factor, the phase noise performance can be enhanced. Moreover, a clear tradeoff between power dissipation and Q can be made to meet high stability and low power oscillator specifications.

The concept of phase noise can be described mathematically. Consider the ideal output of an oscillator circuit, represented mathematically by (4):

$$v_0(t) = V_0 \sin(2\pi f_0 t) \quad (4)$$

$V_o$ is the signal amplitude and t is time. The Fourier transform of this function will be an impulse, or Dirac-delta function, in the frequency domain at the frequency $f_0$, as described previously. Now consider the introduction of phase noise. The output signal in the time domain is then described by the following expression:

$$v_0(t) = V_0 \sin(2\pi f_0 t + \phi(t)) \quad (5)$$

where $\phi(t)$ represents the phase noise-a stochastic process.

The manner in which arbitrary noise injection translates into phase noise can be understood through examination of Hajimiri's Time-Varying Phase Noise Model. First, consider an ideal LC network. Since the network is lossless, any noise introduced into the circuit will be sustained infinitely. Now, consider an impulse current that is injected into the circuit at some time $\tau$. It is clear that if the impulse occurs at an oscillation peak, the signal becomes amplitude modulated. Thus, the output does not deviate from the initial center frequency, but the amplitude changes indefinitely. However, if the impulse occurs some time between peaks, it is clear that the phase of the oscillation is perturbed. Therefore, noise introduced while the output is in this portion of the cycle will contribute significantly to the phase noise, while noise introduced at the peaks of oscillation will not contribute at all. An impulse sensitivity function (ISF) can be assigned to a given oscillator topology. This function describes the time-domain regions where the oscillator is most sensitive to noise injection, and therefore results in phase noise. A typical LC oscillator is most sensitive to noise at the zero-crossings and least sensitive at the peaks. The corresponding ISF, $\Gamma(\omega t)$, represents this concept.

This relatively straightforward theory can be utilized to explain phase noise performance of a variety of oscillator topologies. For example, ring oscillators are common in low performance digital systems. These oscillators make use of an odd number of inverters in a chain. The ISF is maximized at the zero-crossings and minimized while the output is flat. Upon inspection of the ring oscillator circuit, it is clear that the output signal is flat when one of the devices is off and the other is operated in the linear region. While the devices are in these regions of operation, little noise is coupled to the output. However, while the signal is crossing zero, both devices are on and saturated. Here, the potential for noise injection is maximized since it can originate from either device or either supply rail. Unfortunately, this corresponds to the point where the ISF function is maximized. Thus, this simple analysis clearly indicates the reason why ring oscillators exhibit such poor phase noise performance. Moreover, the design objective of a topology such as this one is to switch the devices as quickly as possible. Thus, the duration of time where the ISF is non-zero is minimized.

LC oscillators do not suffer from this problem. The choice of LC oscillator topology will dictate the phase noise performance since the injection of energy into the tank is highly dependent on the configuration. Given the discussion above, a topology that injects energy while the ISF is minimized and does not inject energy while it is maximized is highly desirable. Many LC configurations approach this performance. For example, in the Colpitts configuration, the active device injects current at the voltage peaks, which corresponds to points where the ISF is low. This is why the Colpitts configuration is so common. The phase noise performance is excellent.

Technologies

Many different technologies for oscillators and clock generation circuits exist, the most prevalent of which is the crystal-based oscillator. Crystals are macroscopic off-chip components that are utilized for their high quality factor and thus high performance in oscillator applications. The majority of electronic systems today utilize a crystal oscillator. The drawbacks of crystals include the fact that they are relatively expensive, large, and cannot be integrated with the transistor electronics. The crystal is typically off-chip and it can occupy a board area that is a substantial fraction of the integrated circuits it supports. In dense embedded applications, this is a significant bottleneck toward miniaturization. Moreover, the cost of these crystals can, in fact, approach the cost of the supported integrated circuit itself.

In low performance applications, on-chip oscillators are commonly utilized because they can be manufactured cheaply and with minimum usage of silicon die area. However, as discussed previously, integrated topologies such as the ring oscillator suffer from very poor phase noise performance. Some of the contributing factors to this can be alleviated with careful design techniques, but even under these conditions, high performance cannot be achieved. Additional integrated topologies include the use of on-chip planar capacitors and inductors to form an LC-tank. Typically, these LC-tanks will provide a reference that is more stable than a ring oscillator, but performance is still poor due to the lack of high quality inductors and capacitors in standard CMOS technology. This can be attributed mostly to loss to the substrate as well as the series resistance in each device. For example, poly-poly capacitors have a very high series resistance and thus the Q is degraded significantly.

MEMS can provide both integration and high performance. A variety of high-Q MEMS components have been demonstrated to date, including MEMS mechanical resonators, resonant cavities, and resonant films, just to name a few.

For embedded microcontroller applications, a crystal is typically used in a phase-locked-loop (PLL) where the low frequency reference is multiplied up from tens of megahertz to hundreds of megahertz or a few gigahertz. A $f_{ref}$ is typically generated from a low frequency crystal-based oscillator. The phase detector compares this phase to that of the signal coming from the VCO, which has been divided by the prescalar. After filtering, the VCO is controlled by this output signal. Significant cost, size, and power consumption improvements could be realized if the PLL and crystal oscillator could be replaced with a single, on-chip, high performance, tunable oscillator.

Through the use of a dynamic clock frequency, power savings can be achieved by reducing the clock frequency while low performance operations are executed in the core of the microcontroller. This relationship between dynamic power and frequency is represented by (6):

$$P = \alpha C_L V_{DD}^2 f \quad (6)$$

Here, P is the dynamic power dissipation, α represents the positive switching frequency as a percentage, $C_L$ is the load capacitance, $V_{DD}$ is the power supply voltage, and $f$ is the clock frequency. Thus, power and frequency are directly proportional and the ability to tune the clock frequency translates directly into power savings. Additionally, a VCO could be used to over clock the system if an error checker is implemented in the core. Then, the VCO can be tuned to run as fast as possible in very high performance applications.

Much research and development has been underway for some time to integrate a variety of microelectronic components that are currently off-chip. The supporting electronics, such as the crystal, for oscillator circuitry are one of the key areas where integration is yet to be achieved. Here, the motivation for integration is addressed, as well as the challenges associated with integrating oscillators.

Motivation for Integration

The benefits associated with high levels of microelectronic integration are many. First and foremost is cost. The majority of the cost associated with an integrated circuit is in the package for that circuit. Therefore, in any system, if the number of IC components could be reduced, the overall system cost would be reduced dramatically. Also of significant importance is power, especially with the growing importance of portable devices. The power required to transmit signals across a printed circuit board is approximately an order of magnitude larger than the power required to transmit signals internally on an IC. Significant power savings can therefore be obtained through integration at the IC level. Lastly, a major impetus in IC technology recently is size reduction. In many applications, size and weight are paramount. Integration significantly reduces the size of microelectronic systems.

Challenges Associated with Integrating Oscillator Circuits

As described previously, the majority of oscillator circuits utilize quartz crystal technology. In order to be feasible, an integrated solution must provide comparable performance. This is a difficult task since the majority of on-chip integrated oscillators exhibit very poor performance due to the lack of high Q-factor components on-chip.

Also of interest is the fabrication technology. If MEMS is to truly be adopted as a solution for integrated oscillators, it must be simple, cost effective, and truly compatible with CMOS process technology. Several approaches have been adopted to integrate MEMS technology with CMOS. These include a preprocessing MEMS-first approach, such as Sandia's iMEMS process and UC-Berkeley's MICS process, a mixed MEMS and circuits technique, and a post-processing, MEMS-last approach. Most commercial foundries, however, will not accept preprocessed wafers due to concern for contamination of the facility.

SOI Technology

Important differences between a bulk silicon nFET device and an SOI nFET device include the presence of the BOX and the oxide surrounding the SOI device, which provides superior isolation between devices when compared to bulk silicon. Also, the junction capacitance of the SOI device is an order of magnitude less than that of the bulk device which translates directly into higher speed and lower power. Other advantages of SOI technology include reduced short channel effects, due to the shallow source and drain regions of the device. Additionally, SOI devices exhibit better sub-threshold slope, the absence of body effect, improved packing density, and latch-up immunity.

An SOI device may be either fully-depleted (FD) or partially-depleted (PD). When an FD device is on, the body under the gate is fully depleted of charge. However, the threshold voltage of the device is a strong function of the silicon layer thickness and therefore it is difficult to control. Moreover, the source and drain junctions are very shallow and hence the source and drain resistance is high, which is undesirable. Most SOI work to date has been in PD SOI, where the gate depletes only part of the body under it. This technology overcomes the problems associated with FD SOI, but introduces what are known as floating-body effects. These effects can be attributed to the fact that the body of the device is not fully depleted when it is on. As such, these devices exhibit shifts in the threshold voltage as well as hysteretic timing patterns due to charging of the body from impact ionization. Nevertheless, PD SOI has been demonstrated to yield 20–35% improvement in performance over bulk silicon and thus the majority of recent work has been in PD SOI.

CMOS Integration Opportunities

SOI is emerging as the ideal substrate for integration of a variety of technologies. First, the BOX and isolation oxide significantly reduce coupling between devices. Therefore, analog, mixed-signal, digital, and RF electronics can be integrated onto a single chip—a challenge in bulk CMOS due to poor isolation. Moreover, it has been demonstrated that high performance and low cost MEMS devices can be fabricated in SOI. Lastly, the speed and power performance gains realized in SOI make it the emerging substrate of choice for SoC and Microsystem solutions.

Despite the inherent benefits of SOI technology, the vast majority of integrated circuits are currently fabricated in bulk CMOS. Modern bulk processes offer many opportunities to integrate a variety of technologies onto a single chip. For example, Taiwan Semiconductor Manufacturing Company's mixed-mode processes support multiple metal layers for extensive routing, MiM capacitors for analog and RF circuits, and a thick top metal layer for RF devices such as inductors.

MEMS in CMOS

Much previous work has demonstrated MEMS technology where it is claimed that the MEMS devices are compatible with CMOS technology. However, these reported devices all require some specialized processing steps that are substantially different from standard CMOS manufacturing. No previous work has actually demonstrated MEMS devices in a truly standard CMOS manufacturing process along with active transistor electronics in the same process.

MEMS devices in SOI have recently emerged as a topic of great interest. The overall structure of an SOI substrate provides many opportunities for manufacturing MEMS devices with low process complexity. For example, the device layer of an SOI wafer can be utilized as the structural material for a MEMS device. This material is single crystal silicon and thus, the material properties are superior to those of polycrystalline silicon. Moreover, the BOX can be utilized as a built-in release layer for these structures. In fact, suspended, single crystal silicon devices can be fabricated with one mask using this technique. Additionally, the BOX can be used as an etch stop for backside or frontside etching. This is useful for applications where regions of the substrate are to be removed around a device in order to minimize coupling loss.

Low Noise and Weak Inversion Circuits

Weak inversion is the device operation regime in which a MOS device has not been fully inverted. Full inversion occurs when the device gate voltage exceeds the threshold voltage and a channel is induced between the source and drain. For voltages in the range where surface inversion occurs, but less than the threshold voltage, the device is said to be in weak inversion. This area of operation has many interesting properties, the most notable of which enhanced transconductance of the device. The transconductance in this regime is given by the following expression:

$$g_m = \frac{I_D}{V_T} \qquad (7)$$

Here, $I_D$ is the drain current and $V_T$ is the thermal voltage. This expression compares to the following expression for devices in strong inversion, $$g_m = \sqrt{2\mu C_{ox} \frac{W}{L} I_D} \qquad (8)$$

where $\mu$ is mobility, $C_{ox}$ is the MOS capacitance, and W and L are the length and width of the device, respectively. Clearly, the transconductance of the device is proportional to the root of $I_D$ in strong inversion and is directly proportional to $I_D$ in weak inversion. As such, weak inversion is very attractive since the current drive, and thus the gain of the device, can be maximized with the minimum current. Therefore, power consumption can be minimized. In oscillator applications, this approach is highly appropriate because a minimum loop gain is required to start-up the oscillation. With the use of weak inversion techniques, this start-up can be achieved with the minimum power. One of the lowest power VCOs to date has been demonstrated using weak inversion techniques.

MEMS LC Components

One of the most common topologies for high performance VCOs is the LC-tank. This is largely due to the fact that LC-tanks can be integrated easily with CMOS technology and the performance of an LC-tank is superior to that of integrated ring oscillators. The performance of the LC-tank is best characterized by its quality factor. LC-tanks with high Q-factors will provide a narrow response and thus be appropriate for stable, high performance oscillators. Therefore, maximizing the quality factor of LC-tanks is a subject of much research.

Much work has been completed to date in the area of micromachined varactors. The simplest topology for such a device is shown in FIGS. 1 and 2. Young and Boser discloses a movable metal top plate, typically aluminum (Al), is suspended over a fixed bottom plate and supported by a mechanical network of arms as shown in FIG. 1. By applying a voltage, $V_{DC}$, across the device, the movable top plate will deflect some distance x and thus the capacitance of the device is modulated. The varactor serves as the variable device for tuning the VCO.

Recall that capacitance is given by the following relationship:

$$C = \frac{\varepsilon A}{x_o} \tag{9}$$

where $\varepsilon$ is the permitivity of air, A is the plate overlap area, and $x_o$ is the nominal distance between the plates. Thus, for the varactor, this expression becomes:

$$C = \frac{\varepsilon A}{x_o - x} \tag{10}$$

where x is some displacement forced by the tuning voltage. The electrostatic force generated between the plates by this voltage is given by the following relationship:

$$F_e = \frac{1}{2}\frac{\partial C}{\partial x}V_{DC}^2 = \frac{1}{2}\frac{CV_{DC}^2}{(x_o - x)^2} \tag{11}$$

The effective electrical spring constant is given by (12):

$$k_e = \left|\frac{\partial F_e}{\partial x}\right| = \frac{CV_{DC}^2}{(x_o - x)^2} \tag{12}$$

A mechanical spring constant, $k_m$, is associated with the top plate suspension and a restoring force, $F_m$, is generated by this suspension. The relationship between $k_m$ and $F_m$ is given by Hooke's Law.

$$F_m = k_m x \tag{13}$$

The magnitudes of $F_m$ and $F_e$ are equal at equilibrium.

$$k_m x = \frac{1}{2}\frac{CV_{DC}^2}{(x_o - x)} = \frac{1}{2}k_e(x_o - x) \tag{14}$$

Lastly, the expression for $k_e$ in terms of $k_m$ can written as follows:

$$k_e x = \frac{2k_m x}{(x_o - x)} \tag{15}$$

When $x = x_o/3$, the two spring constants are equal. Beyond this point, the electrical force exceeds the maximum mechanical restoring force and the plates are pulled together. Thus, the tuning voltage associated with a deflection of $x = x_o/3$ is called the pull-in voltage. It is trivial to show that the theoretical tuning range of this device is then 50%.

In FIG. 2, $C_{TP}$ and $C_{BP}$ represent the parasitic capacitance to the substrate. These parasitic capacitors are what degrade the tuning range as shown in the work by Young and Boser. Typically in an oscillator application, $C_{BP}$ is negligible because the bottom plate and the substrate are both grounded. However, $C_{TP}$ appears in parallel with the tunable capacitor. Moreover, the relatively large tuning voltage is across it. Thus, this device cannot achieve the theoretical tuning range because $C_{TP}$ limits the amount that the total capacitance can be modulated by the deflection of the top plate.

This work was extended by Zou et al. and a tuning range of 69.8% was achieved. The modification they introduced is illustrated in FIG. 3. Here the control voltage is applied across a large gap while the tunable section of the varactor is across a small gap. Though this clever technique has greatly enhanced the tuning range, it is not CMOS compatible.

Yao et al. demonstrated a tuning range of 300% using lateral comb structures which were fabricated using a deep reactive ion etch (DRIE) technique in SOI, but these devices pose integration problems with standard CMOS processing and consequently may not be appropriate for monolithic applications. Table I summarizes previous work in this field.

TABLE I

Summary of Previous MEMS Varactor Work

| Reference | Device | Tuning Range | Nominal Capacitance | Q | Frequency | Year |
|---|---|---|---|---|---|---|
| Yoon and Nguyen | Parallel plate | 7.7% | 1.14 pF | 291 | 1 GHz | 2000 |
| Zou et al. | Modified parallel plate | 69.8% | 58 fF | NA | NA | 2000 |
| Yao et al. | Comb | 300% | 1–5 pF | 100 | 400 MHz | 1998 |
| Fan et al. | Suspended parallel plate | NA | 500 fF | NA | NA | 1998 |
| Young and Boser | Parallel plate | 16% | 2 pF | 60 | 1 GHz | 1997 |

A wide variety of high performance integrated inductors have been demonstrated recently using micromachining technology. Many of these devices have achieved a high quality factor. For example, Yeh et al. have demonstrated a copper-encapsulation technique that yielded inductors with Q-factors over 30 at 5 GHz. Yoon et al. have shown a Q-factor of 16.7 at 2.4 GHz using a solenoid structure in electroplated copper.

A key factor in inductor Q performance is loss to the substrate, due to eddy currents, and series resistance in the device material. Because of this, suspended inductors and copper inductors have been a subject of much research. For example, Fan et al. demonstrated a high performance suspended inductor using micromachined hinges that raised the inductor 250 µm over the substrate. A summary of this previous work is shown in Table II.

TABLE II

Summary of Previous Integrated Inductor Work

| Reference | Device | Nominal Capacitance | Q | Frequency | Year |
| --- | --- | --- | --- | --- | --- |
| Rogers et al. | Cu-plated | 2.6 nH | 17 | 2.5 GHz | 2001 |
| Yeh et al. | Cu-encapsulated | 2–12 nH | 30 | 5 GHz | 2000 |
| Yoon et al. | Cu-plated Solenoid | 2.67 nH | 16.7 | 2.4 GHz | 1999 |
| Ribas et al. | Suspended | 4.8 nH | 16 | 16 GHz | 1998 |
| Fan et al. | Suspended | 24 nH | NA | 6.6 GHz | 1998 |
| Young et al. | 3D Cu Coil | 4.8 nH | 30 | 1 GHz | 1997 |
| Hisamoto et al. | Suspended in SOI | 7.7 nH | 11 | 19.6 GHz | 1996 |

Many of these devices pose significant challenges in terms of integration with CMOS technology. In fact, some are not at all compatible with CMOS.

A wide variety of integrated oscillators have been reported. Moreover, many different technologies have been explored in order to achieve fully integrated oscillators. The significant figures of merit for these devices include the power and phase noise performance for each oscillator. Table III summarizes the recent work in the field.

TABLE III

Summary of Recent VCO Work

| Reference | Technology | Phase Noise Density | Power | Frequency | Year |
| --- | --- | --- | --- | --- | --- |
| Rogers et al. | Cu inductors, Bipolar | −106 dBc/Hz @100 kHz | 18 mW | 2 GHz | 2001 |
| Samori et al. | Bipolar | −104 dBc/Hz @100 kHz | 14 mW | 2.6 GHz | 2001 |
| DeMuer et al. | Planar IC inductor, BiCMOS | −125 dBc/Hz @600 kHz | 34.2 mW | 2 GHz | 2000 |
| Dec and Suyama | MEMS varactor, Bondwire inductor, CMOS | −126 dBc/Hz @600 kHz | 15 mW | 1.9 GHz | 2000 |
| Dec and Suyama | MEMS varactor, Bondwire inductor, CMOS | −122 dBc/Hz @1 MHz | 13.5 mW | 2.4 GHz | 2000 |
| Klepser and Kucera | Integrated inductor, Varactor diode, BiCMOS | −129 dBc/Hz @3 MHz | 18 mW | 2.4 GHz | 2000 |
| Zannoth et al. | Planar IC inductor, Bipolar | −139 dBc/Hz @4.7 MHz | 29.7 mW | 1.8 GHz | 2000 |
| Harada et al. | Planar IC inductor, CMOS/SIMOX | −110 dBc/Hz @1 MHz | NA | 2 GHz | 2000 |
| Hung and Kenneth | Planar IC and bond-wire inductor, CMOS | −126 dBc/Hz @600 kHz | 12.7 mW | 1.1 GHz | 2000 |
| Svelto et al. | MOS varactor, Bondwire inductor, CMOS | −119 dBc/Hz @600 kHz | 12 mW | 1.3 GHz | 2000 |
| Young et al. | MEMS varactor, CMOS | −105 dBc/Hz @100 kHz | NA | 1 GHz | 1999 |
| Zohios et al. | Integrated Cu inductor, Diode, BiCMOS | −122 dBc/Hz @600 kHz | 21 mW | 1 GHz | 1999 |
| Young et al. | MEMS varactor, 3D coil inductor, CMOS | −136 dBc/Hz @3 MHz | 43 mW | 859 MHz | 1998 |
| Roessig et al. | MEMS resonator, CMOS | −88 dBc/Hz @500 Hz | NA | 1.022 MHz | 1998 |
| Craninckx and Steyaert | Planar IC inductor, CMOS | −116 dBc/Hz @600 kHz | 6 mW | 1.8 GHz | 1996 |
| Craninckx and Steyaert | Bondwire inductor, CMOS | −115 dBc/Hz @200 kHz | 28 mW | 1.8 GHz | 1995 |

Many single-package clock parts are commercially available from companies such as Texas Instruments and distributed by electronics distributors such as Digi-Key. These clocks typically make use of a macroscopic crystal as the time reference for the system. Moreover, these clocks tend to consume significant power. A simple ring oscillator that many circuit design companies use is suitable for only the very lowest performance applications.

Much technology has been developed for radio frequency (RF) applications. Significant contributions in this area are cited in the following section. The focus of these works has been to develop a low phase noise oscillator for cellular communications.

Documents of Relevant Technologies

MEMS Varactor

U.S. Pat. No. 6,242,989: "Article comprising a Multi-Port Variable Capacitor."

U.S. Pat. No. 5,959,516: "Tunable-Trimmable Micro Electro Mechanical System (MEMS) Capacitor."

U.S. Pat. No. 6,215,644: "High Frequency Tunable Capacitors."

D. Young et al., "A Micromachined-Based RF Low-Noise Voltage-Controlled Oscillator," IEEE CUSTOM INTEGRATED CIRCUITS CONFERENCE, pp. 431–434, 1997.

J. Zou et al., "Development of a Wide Tuning Range MEMS Tunable Capacitor for Wireless Communication Systems," INTERNATIONAL ELECTRON DEVICES MEETING, pp. 403–406, 2000.

J. Yao et al., "High Tuning Ratio MEMS Based Tunable Capacitors for RF Communications Applications," SOLID-STATE SENSORS AND ACTUATORS WORKSHOP, pp. 124–127, 1998.

J.-B. Yoon et al., "A High-Q Tunable Micromechanical Capacitor with Moveable Dielectric for RF Applications," INTERNATIONAL ELECTRON DEVICES MEETING, pp. 20.4.1–20.4.4, 2000.

L. Fan et al., "Universal MEMS Platforms for Passive RF Components: Suspended Inductors and Variable Capacitors," pp. 29–33, 1998.

U.S. Pat. No. 6,232,847: "Trimmable Singleband and Tunable Multiband Integrated Oscillator Using Micro-Electromechanical System (MEMS) Technology."

MEMS Inductor

L. Fan et al., "Universal MEMS Platforms for Passive RF Components: Suspended Inductors and Variable Capacitors," pp. 29–33, 1998.

J.-L. Yeh et al., "Copper-Encapsulated Silicon Micromachined Structures," IEEE JOURNAL OF MICROELECTROMECHANICAL SYSTEMS, Vol. 9, No. 3, pp. 281–287, September 2000.

J.-B. Yoon et al., "Surface Micromachined Solenoid On-Si and On-Glass Inductors for RF Applications," IEEE ELECTRON DEVICE LETTERS, Vol. 20, No. 9, pp. 487–489, September 1999.

J. W. Rogers et al., "Post-Processed Cu Inductors with Application to a Completely Integrated 2-GHz VCO," IEEE TRANSACTIONS ON ELECTRON DEVICES, Vol. 48, No. 6, pp. 1284–1287, June 2001.

R. P. Ribas et al., "Monolithic High-Performance Three-Dimensional Coil Inductors for Wireless Communication Applications," INTERNATIONAL ELECTRON DEVICES MEETING, pp. 3.5.1–3.5.4, 1997.

D. Hisamoto et al., "Silicon RF Device Fabricated by ULSI Processes Featuring 0.1-$\mu$m SOI-CMOS and Suspended Inductors," SYMPOSIUM ON VLSI TECHNOLOGY DIGEST OF TECHNICAL PAPERS, pp. 104–105, 1996.

R. P. Ribas, et al., "Micromachined Planar Spiral Inductor in Standard GaAs HEMT MMIC Technology," IEEE Electron Device Letters, vol. 19, no. 8, pp. 285–287, August 2000.

Circuit Topology and Monolithic Oscillators

U.S. Pat. No. 6,292,065, "Differential Control Topology for LC VCO."

J. W. Rogers et al., "A Completely Integrated 2 GHz VCO with Post-Processed Cu Inductors," IEEE CUSTOM INTEGRATED CIRCUITS CONFERENCE, pp. 575–578, 2001.

C. Samori et al., "A Fully-Integrated Low-Power Low-Noise 2.6-GHz Bipolar VCO for Wireless Applications," IEEE MICROWAVE AND WIRELESS COMPONENTS LETTERS, Vol. 11, No. 5, pp. 199–201, May 2001.

B. DeMuer et al., "A 2-GHz Low-Phase-Noise Integrated LC-VCO with Flicker-Noise Upconversion Minimization," IEEE JOURNAL OF SOLID-STATE CIRCUITS, Vol. 35, No. 7, pp. 1034–1038, July 2000.

A. Dec et al., "Microwave MEMS-Based Voltage-Controlled Oscillators," IEEE TRANSACTIONS ON MICROWAVE THEORY AND TECHNIQUES, Vol. 48, No. 11, pp. 1943–1949, November 2000.

I. Novof, et al., "Fully-integrated CMOS phase-locked loop with 15 to 240 MHz locking range and ±50 ps jitter," Solid-State Circuits Conference, 1995. Digest of Technical Papers. $42^{nd}$ ISSCC, 1995 IEEE International, 15–17 Feb. 1995, pp. 112–113, 347.

A. Dec et al., "Microwave MEMS-Based Voltage-Controlled Oscillators," IEEE TRANSACTIONS ON MICROWAVE THEORY AND TECHNIQUES. Vol. 48, No. 11, November 2000.

B.-U. Klepser et al., "A Fully Integrated SiGe Bipolar 2.4 GHz Bluetooth Voltage Controlled Oscillator," IEEE RADIO FREQUENCY INTEGRATED CIRCUITS SYMPOSIUM, pp. 61–64, 2000.

M. Zannoth et al., "A Single-Chip Si-Bipolar 1.6-GHz VCO With Integrated-Bias Network," IEEE TRANSACTIONS ON MICROWAVE THEORY AND TECHNIQUES, Vol. 48, No. 2, pp. 203–205, February 2000.

M. Harada et al., "2-GHz RF Front-End Circuits in CMOS/SIMOX Operating at an Extremely Low Voltage of 0.5 V," IEEE JOURNAL OF SOLID-STATE CIRCUITS, Vol. 35, No. 12, pp. 2000–2004, December 2000.

C.-M. Hung et al., "A Packaged 1.1-GHz CMOS VCO With Phase Noise of −126 dBc/Hz at a 600-kHz Offset," IEEE JOURNAL OF SOLID-STATE CIRCUITS, Vol. 35, No.1, pp. 100–103, January 2000.

F. Svelto et al., "A 1.3 GHz Low-Phase Noise Fully Tunable CMOS LC VCO," IEEE JOURNAL OF SOLID-STATE CIRCUITS, Vol. 35, No. 3, pp. 356–361, March 2000.

J. Zohios et al., "A Fully Integrated 1 GHz BiCMOS VCO," PROCEEDINGS OF THE 6TH IEEE INTERNATIONAL CONFERENCE ON ELECTRONICS, CIRCUITS AND SYSTEMS, Vol. 1, pp. 193–196, 1999.

D. J. Young et al., "A Low-Noise RF Voltage-Controlled Oscillator Using On-Chip High-Q Three-Dimensional Coil Inductor And Micromachined Variable Capacitor," SOLID-STATE SENSOR AND ACTUATOR WORKSHOP, pp. 128–131, 1998.

T. A. Roessig et al., "Surface-Micromachined 1 MHz Oscillator With Low-Noise Pierce Configuration," SOLID-STATE SENSOR AND ACTUATOR WORKSHOP, 1998.

J. Craninckx et al., "A 1.8-GHz CMOS Low-Phase-Noise Voltage-Controlled Oscillator Using Optimized Hollow Spiral Inductors," IEEE JOURNAL OF SOLID-STATE CIRCUITS, Vol. 32, No. 5, pp. 736–744, May 1997.

J. Craninckx et al., "A 1.8-GHz CMOS Low-Phase-Noise Voltage-Controlled Oscillator With Prescalar," IEEE JOURNAL OF SOLID-STATE CIRCUITS, Vol. 30, No. 12, pp. 1474–1482, December 1995.

D. Young et al., "A Micromachined-Based RF Low-Noise Voltage-Controlled Oscillator," IEEE CUSTOM INTEGRATED CIRCUITS CONFERENCE, pp. 431–434, 1997.

SUMMARY OF THE INVENTION

A teaching of the present invention includes MEMS-based, computer systems, clock generation and oscillator circuits and an LC-tank apparatus for use therein. The circuits and apparatus may be fabricated on a single substrate without the need for external components.

In one embodiment, a MEMS-based clock generation circuit for generating a highly stable, digital output signal without the need for external components is provided. The circuit includes a substrate and an oscillator fabricated on the substrate. The oscillator includes a high-Q MEMS LC-tank apparatus for generating a high frequency, periodic signal. The circuit also includes first circuitry also fabricated on the substrate for converting the periodic signal into a high frequency digital output signal.

The periodic signal may be sinusoidal and has an original frequency. The output signal may be a square wave signal having a frequency at half of the original frequency.

The clock generation circuit may further include second circuitry also fabricated on the substrate for dividing the frequency of the digital output signal to the at least one lower desired application frequency and, consequently, reduce phase noise of the signal thereby enhancing stability.

The first and second circuitry and the oscillator may be fabricated on the substrate with a CMOS-compatible process.

The CMOS-compatible process may be a bulk or SOI CMOS process.

The periodic signal may be a sinusoidal differential signal, and the first circuitry may convert the differential signal into a single-ended signal.

The first circuitry may also convert the single-ended signal into the high frequency square-wave digital output signal.

The second circuitry may include at least one flip-flop coupled to the first circuitry for dividing the frequency of the square-wave digital output signal to the at least one lower desired application frequency.

The substrate may be a bulk or SOI substrate.

In another embodiment, a MEMS-based, oscillator circuit for generating a low noise, high frequency, periodic signal is provided. The oscillator circuit includes a substrate and a high-Q, MEMS LC-tank apparatus fabricated on the substrate with a CMOS-compatible process. The circuit also includes circuitry also fabricated on the substrate with the CMOS-compatible process and coupled to the LC-tank apparatus to generate the periodic signal.

The frequency may be variable to tune the oscillator circuit in response to a control input.

The CMOS-compatible process may be a bulk or SOI CMOS process.

The oscillator circuit may be a double-balanced oscillator circuit to reduce flicker noise upconversion.

The LC-tank may include at least one micromachined varactor having a capacitance which varies in response to the control input.

The at least one varactor may include a top plate, and the circuitry may include bypass capacitors to block the control input to the top plate from the remainder of the circuitry.

The oscillator circuit may be a double-balanced, cross-coupled oscillator circuit to reduce flicker noise upconversion.

In yet another embodiment, a MEMS-based, LC-tank apparatus having a high quality factor is provided. The apparatus includes a substrate and at least one micromachined varactor fabricated on the substrate with a CMOS-compatible process. The apparatus also includes a micromachined inductor coupled to the at least one varactor and fabricated on the substrate with the CMOS-compatible process.

The at least one varactor may have a variable capacitance to provide a tuning range for the apparatus.

The inductor may be suspended above the substrate and released during or upon completion of the CMOS-compatible process.

The inductor may be hollow and suspended above the substrate by anchors which are defined by the CMOS-compatible process.

The at least one varactor may have a fixed bottom plate and a movable top plate suspended above the bottom plate and released during or upon completion of the CMOS-compatible process.

The top plate may deflect based on a control input to tune the capacitance of the at least one varactor.

The top plate may be suspended above the bottom plate by a mechanical suspension network defined by the CMOS-compatible process.

The at least one varactor and the inductor may be defined by conductive layers in the CMOS-compatible process.

The conductive layers may be metal layers.

The CMOS-compatible process may be a bulk or SOI CMOS process.

The top plate may have a plurality of etch holes to facilitate release of the top plate during or upon completion of the CMOS-compatible process.

The substrate may be a bulk or SOI substrate.

The at least one varactor and the inductor may be defined by either MiM layers or two level metal routing layers.

In a still further embodiment, a MEMS-based, clock generation circuit for generating a highly stable, digital output signal is provided. The circuit includes an oscillator fabricated on a first substrate and includes a high-Q MEMS LC-tank apparatus for generating a periodic signal. The circuit further includes first circuitry fabricated on a second substrate for converting the periodic signal into a high frequency digital output signal.

The first and second substrates may be distinct, or may be the same such that the clock generation circuit may be a monolithic circuit.

In yet another embodiment, a computer system is provided. The computer system includes a databus, a central processing unit coupled bi-directionally to the databus, transient memory coupled bi-directionally to the databus, and persistent memory coupled bi-directionally to the databus. The computer system further includes a MEMS-based clock generation circuit for generating a highly stable, digital output signal suitable for use within the computer system. The clock generation circuit includes an oscillator fabricated on a first substrate and a high-Q MEMS LC-tank apparatus for generating a periodic signal. First circuitry is fabricated on a second substrate for converting the periodic signal into a high frequency digital output signal.

The features, and advantages of the present invention are readily apparent from the following detailed description of the best modes for carrying out the invention when taken in connection with the accompanying drawings.

BRIEF DESCRIPTION OF THE DRAWINGS

FIG. 8b is a circuit schematic of a monolithic CMOS-MEMS clock reference circuit of a second embodiment of the present invention;

FIGS. 9a–9d are perspective schematic views which collectively provide an abbreviated fabrication flow diagram for the present invention in a standard bulk or SOI CMOS process.

DETAILED DESCRIPTION OF THE PREFERRED EMBODIMENTS

Figure 1:
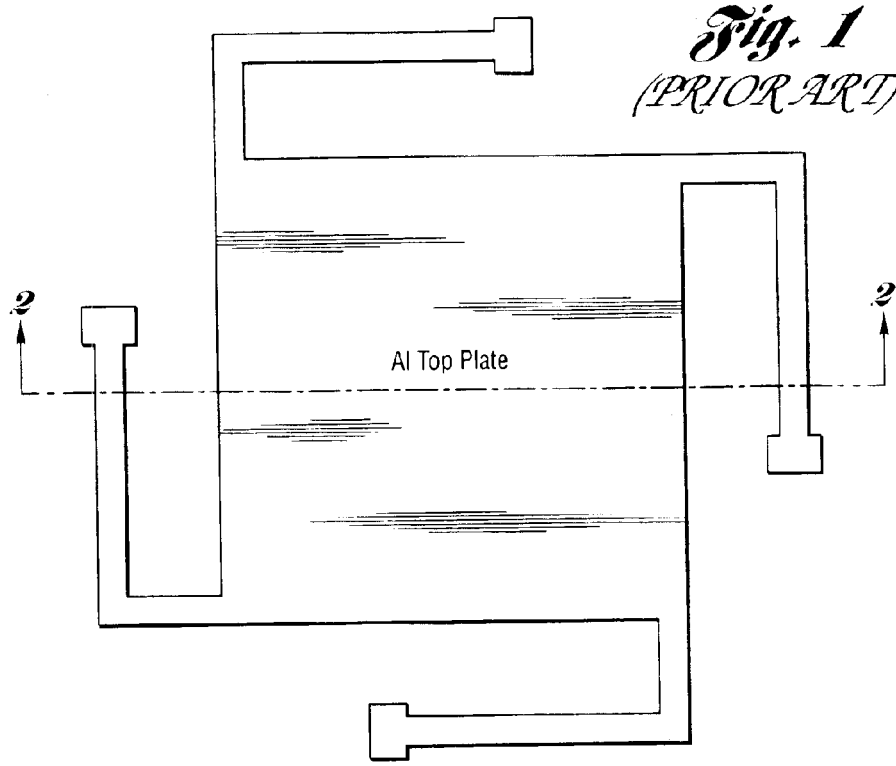
FIG. 1 is a top schematic view of a prior art micromechanical varactor.
Figure 2:
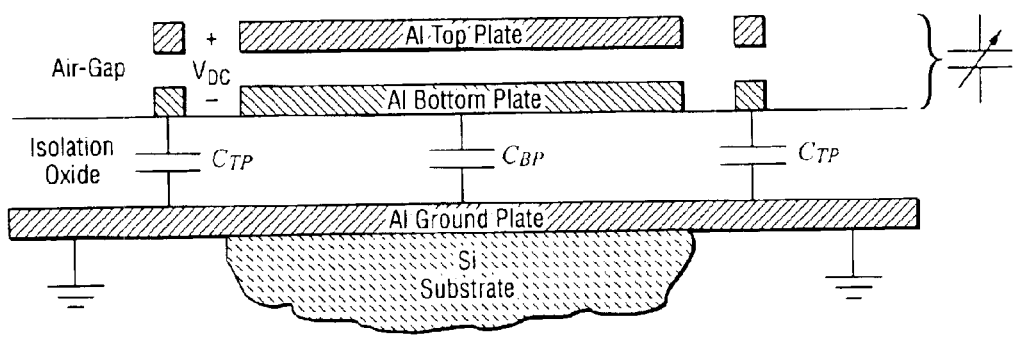
FIG. 2 is a side sectional view, taken along lines 2—2 in FIG. 1, of the prior art varactor.
Figure 3:
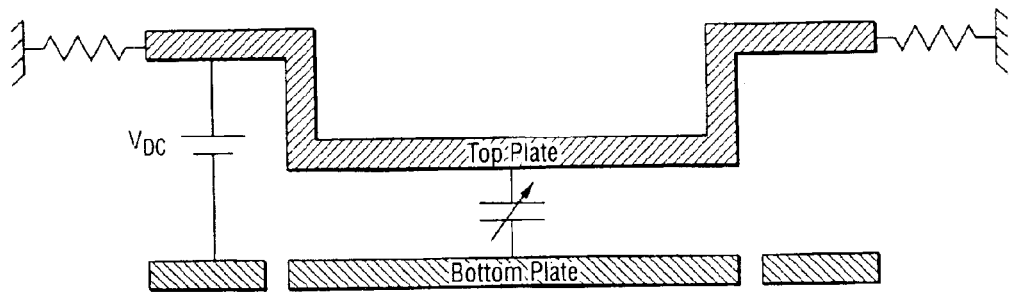
FIG. 3 is a side sectional schematic view of another prior art varactor.
Figure 4A:
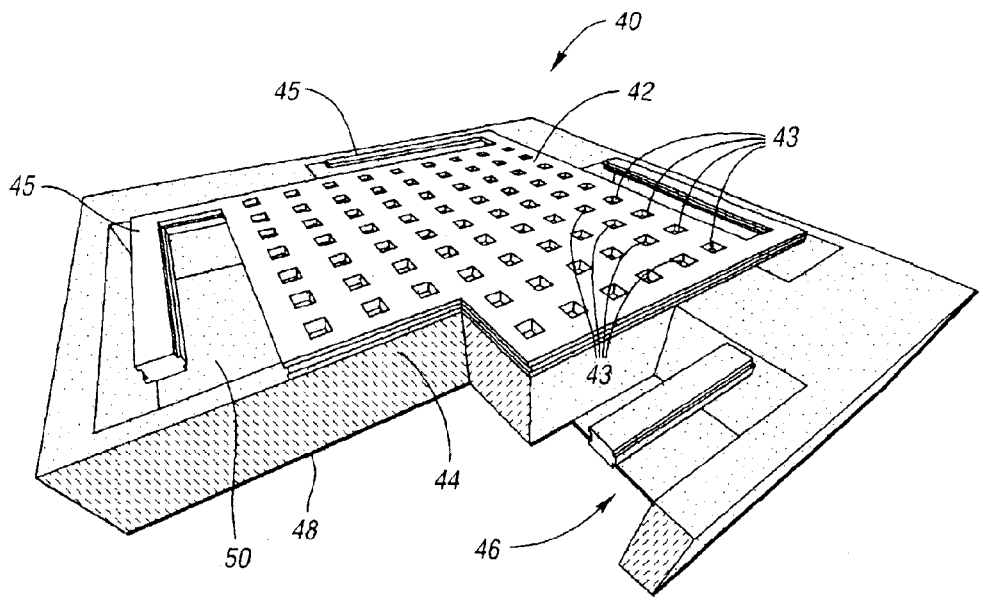
FIG. 4a is a perspective cut-out view of a varactor constructed in accordance with one embodiment of the present invention.

Referring now to FIG. 4a, there is illustrated a first embodiment of a varactor fabricated upon an SOI substrate, generally indicated at 40, which focuses on the most significant drawbacks associated with previous MEMS varactor work. First, the fabrication process is CMOS compatible in order to achieve monolithic integration. Second, the tuning range is sufficiently wide. Third, the quality factor (Q-factor) is high. The varactor 40 addresses all of these issues as follows.

First, the parallel plates 42 and 44 of the varactor 40 are fabricated as part of a standard CMOS process where either the metal-insulator-metal (MiM) layers or the appropriate metal routing layers are used. Support arms 45 support the top plate 42 above the bottom plate 44. These support arms 45 may be designed in one of a variety of geometries in order to suspend the top plate 42 appropriately. No additional processing steps are required to define the structure. However, a maskless post-process is used to release the plates 42 and 44 by removing the insulating material between and above the plates 42 and 44. This release is facilitated by using the standard CMOS process step wherein the bond pad openings are defined. By placing these bond pad windows around the MEMS varactor structure, the device becomes exposed, if not released. Additional etching may be required in order to release the structure, but this etching can be accomplished without additional mask steps as the bond pad etch has already defined a masking window for continued etching. The top plate 42 includes etch holes 43 to facilitate release of the top plate 42.

Second, removal of the substrate 46 below the varactor 40 through a backside etch minimizes parasitic loss and therefore the tuning range is enhanced and approaches the theoretical limit of 50% for the given topology. If the substrate 46 is not removed, a large parasitic capacitance exists in parallel with the varactor 40 and the tuning range is severely degraded as has been observed in previous work. With the use of a high-resistivity SOI substrate 48, this step may be eliminated since the parasitic capacitance is not as severe. The use of an SOI substrate 48 is important to these fabrication options. The intrinsic buried oxide (i.e., BOX 50) is used as a silicon (Si) backside etch stop or as isolation from the high-resistivity substrate 48. This technique cannot be performed with a standard bulk Si substrate since no BOX 50 exists.

Lastly, the varactor 40 has been designed in copper and thus the sheet resistance, as compared to aluminum, is significantly lower, which enhances the Q-factor. No Cu varactor has been reported in the prior art to date. The varactor 40 presents a nominal capacitance set by the varactor geometry and the nominal gap between the plates 42 and 44, $x_o$. By applying a positive DC voltage, $V_{DC}$, across the plates 42 and 44, the movable top plate 54 will deflect some distance, x, due to electrostatic force, thus modulating the capacitance. Therefore, this variable capacitance is described by the following relationship:

$$C = \frac{\varepsilon A}{x_o - x}$$

where $\varepsilon$ is the permittivity of air, A is the plate overlap area, $x_o$ is the nominal distance between the plates 42 and 44, and x is some displacement forced by the DC tuning voltage, $V_{DC}$. It can be shown that the maximum displacement for this topology is $x_o/3$, beyond which the electrical force exceeds the maximum mechanical restoring force and the plates 42 and 44 are pulled together. Further, it can be shown that the theoretical tuning range for the varactor 52 is then 50%.

Performance of the varactor 40 is dependent on material and device geometry. Specifically, the mechanical spring constant associated with the mechanical suspension network 45 will determine the tuning voltage response. Moreover, the device geometry determines the achievable capacitance.

Figure 4B:
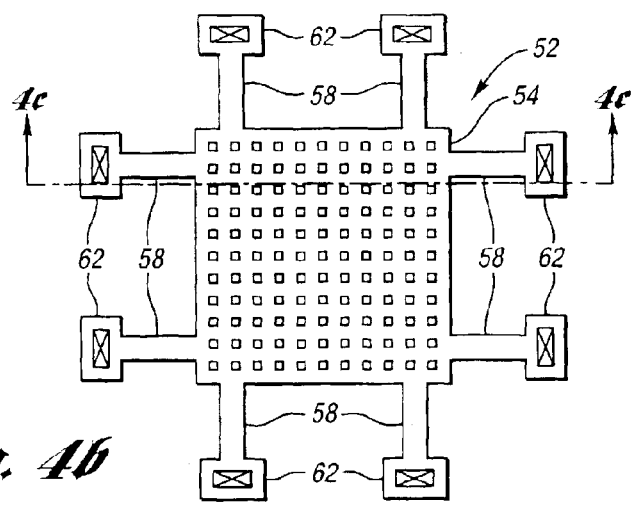
FIG. 4b is a top schematic view of a varactor constructed in accordance with a second embodiment of the present invention.
Figure 4C:
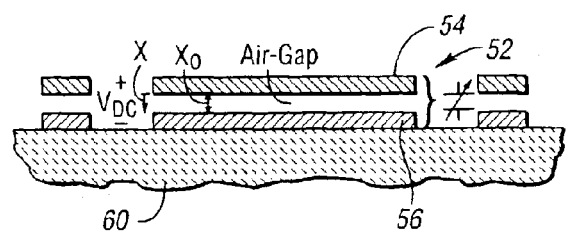
FIG. 4c is a side sectional, partially broken away view, taken along lines 4c–4c in FIG. 4b, of the second embodiment of the present invention.

Referring now to FIGS. 4b and 4c, there is illustrated a second embodiment of a varactor fabricated in a bulk CMOS process, generally indicated at 52, of the present invention. The varactor 52 includes a movable top plate 54 and a stationary bottom plate 56. The top plate 54 is supported above the bottom plate 56 by a mechanical suspension network 58 which is anchored to a substrate 60 at anchors 62.

In particular, the micromechanical varactor 52 has a parallel plate topology similar to those presented in the prior art. The varactor 52 is constructed by mechanically suspending the metal top plate 54 in air above the fixed metal bottom plate 56. The mechanical suspension network 58 provides support for the top plate 54 as shown. The varactor 52 presents a nominal capacitance set by the varactor geometry and the nominal gap between the plates 54 and 56, $x_o$. By applying a positive DC voltage, $V_{DC}$, across the plates 54 and 56, the movable top plate 54 will deflect some distance, x, due to electrostatic force, thus modulating the capacitance. Therefore, this variable capacitance is described by the following relationship:

$$C = \frac{\varepsilon A}{x_o - x}$$

where $\varepsilon$ is the permittivity of air, A is the plate overlap area, $x_o$ is the nominal distance between the plates 54 and 56, and x is some displacement forced by the DC tuning voltage, $V_{DC}$. It can be shown that the maximum displacement for this topology is $x_o/3$, beyond which the electrical force exceeds the maximum mechanical restoring force and the plates 54 and 56 are pulled together. Further, it can be shown that the theoretical tuning range for the varactor 52 is then 50%.

Performance of the varactor 52 is dependent on material and device geometry. Specifically, the mechanical spring constant associated with the mechanical suspension network 58 will determine the tuning voltage response. Moreover, the device geometry determines the achievable capacitance. The varactor 52 was designed to realize a nominal capacitance near 0.25 pF and to respond to a voltage ranging from 0 to 1.2V. A summary of these device design parameters is given in Table IV:

TABLE IV

MEMS Varactor Design Parameters

| Design Parameter | Value |
| --- | --- |
| Nominal Capacitance (C) | 0.26 pF |
| Topology | Parallel Plate |
| Overlap Area (A) | 1024 $\mu m^2$ |
| Gap Distance ($d_o$) | 34.5 nm |
| Dielectric Relative Permittivity ($\varepsilon_r$) | ~1 |
| Support Beam Length | 8.5 $\mu m$ |
| Support Beam Width | 3 $\mu m$ |
| Support Beam Thickness | 2 $\mu m$ |
| Device Material | Al |
| Tuning Voltage | 0–1.2 V |
| Tuning Range (Theoretical) | 50% |
| Estimated Quality Factor (at 2 GHz) | 60 |

As will be appreciated, the above parameters are merely illustrative of one very specific embodiment of the present invention. Those skilled in the art will readily understand how adjusting these parameters will affect the circuit and, with the teaching of the present invention, be readily capable of designing other circuits such as those described herein.

Figure 5A:
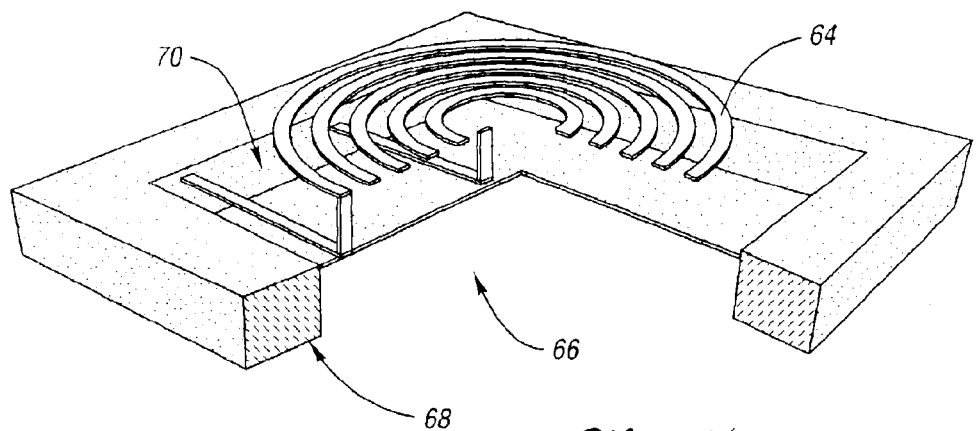
FIG. 5a is a perspective cut-out view of an inductor constructed in accordance with one embodiment of the present invention.

Referring now to FIG. 5a, there is illustrated a first embodiment of the suspended inductor 64 fabricated in a SOI CMOS process compatible with the fabrication process for the varactors 40 and 52 described previously. Specifically, the inductor 64 and its support anchors are defined by the standard SOI CMOS process. The inductor coil 64 is circular and hollow, meaning that the turns of the spiral do not continue completely into the center of the circle, since it is well known that hollow inductors exhibit a superior Q, and the inner windings contribute little to the overall inductance. The coil may also be square or octagonal in order to meet the requirements of CMOS processes. The inductor coil 64 is suspended in a metal layer, and additionally, the substrate below the inductor can be removed, as indicated at 66. As such, parasitic loss to the substrate 68 due to eddy currents can be minimized, the device sheet resistance is low, and a high Q-factor can be attained. As is the case with the varactors 40 and 52, the backside etch step can be eliminated if a high-resistivity SOI substrate is utilized including the BOX 70.

Figure 5B:
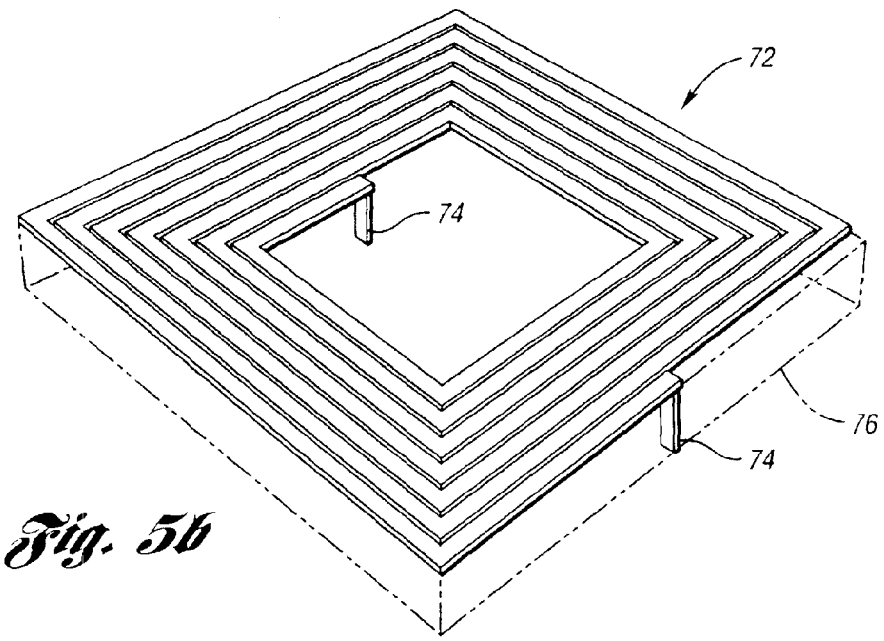
FIG. 5b is a perspective view of an inductor constructed in accordance with a second embodiment of the present invention.

Referring now to FIG. 5b, a second embodiment is illustrated of the suspended inductor fabricated in a bulk CMOS process, generally indicated at 72. The inductor 72 may be square, circular, or octagonal in order to meet the requirements of the CMOS process. The inductor 72 and its support anchors 74 are defined by the standard bulk CMOS process and no additional fabrication steps are required for its definition.

The inductor 72 is coupled with the MEMS varactor 52 of FIGS. 4b and 4c and is a suspended inductor. The inductor 72 is also fabricated in standard CMOS and is suspended above the substrate by anchors 74 that are defined by the standard process. The dielectric material around the inductor 72 is removed so as to increase the quality factor. Removing the dielectric reduces capacitive coupling between the inductor 72 and the substrate 76, thus reducing energy loss from induced eddy currents in the substrate 76. The inductor 72 is also fabricated in the last and thick metal layer to prevent loss due to series resistance. The inductor 72 may also contain a patterned ground shield to reduce the loss due to eddy currents. This ground shield can also be defined by the standard CMOS process.

The device geometry determines the performance. With the use of a simple model, the inductance can be estimated by the following relationship:

$$L \approx \frac{37.5 \mu n^2 a^2}{22r - 14a}$$

where a is the mean radius of the spiral, n is the number of turns, $\mu$ is the permeability of the core, and r is the radius of the spiral.

The design objective for the inductor 72 was to maximize the Q-factor while realizing a nominal inductance of near 10 nH. A summary of the inductor design parameters is given in Table V.

TABLE V

MEMS Inductor Design Parameters

| Design Parameter | Value |
| --- | --- |
| Nominal Inductance (L) | 10 nH |
| Topology | Square Hollow Core |
| Core Relative Permeability ($\mu_r$) | ~1 |
| Number of Turns (n) | 6 |
| Mean Radius (a) | 92.5 μm |
| Radius (r) | 125 μm |
| Hollow Core Radius | 76.25 μm |
| Height | 2 μm |
| Width | 8 μm |
| Turn Spacing | 1.5 μm |
| Device Material | Al |
| Estimated Quality Factor (at 2 GHz) | 20 |

Figure 6:
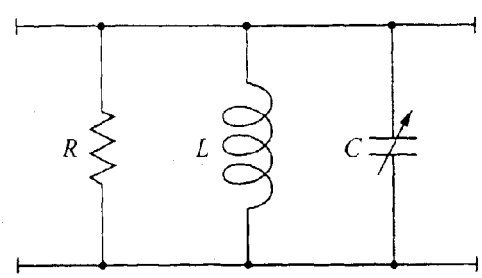
FIG. 6 is a circuit schematic of a tank apparatus of the present invention.

Referring now to FIG. 6, the MEMS varactor and inductor are placed or coupled in parallel to form a tunable LC-tank apparatus, or reference, for an oscillator. To date, no previous work has shown a monolithic MEMS varactor and inductor coupled together in a single compatible process that realizes a high-Q tank apparatus. The tank is essentially an inductor and capacitor in parallel with a parasitic loss element, represented by the resistance, R. The tank apparatus exhibits high-Q performance, as compared to low-Q performance. The coupled tank apparatus provides a response centered tightly around what is called the resonant frequency, $f_o$, of the tank apparatus. This type of performance is desirable when constructing oscillators since a stable frequency output is sought.

There are two primary components of the circuit topology of the first embodiment. First is the low-noise and low-power oscillator core, illustrated in FIG. 7a. Second is the supporting circuitry that realizes the square-wave digital clock output, as shown in FIG. 8a.

Figure 7A:
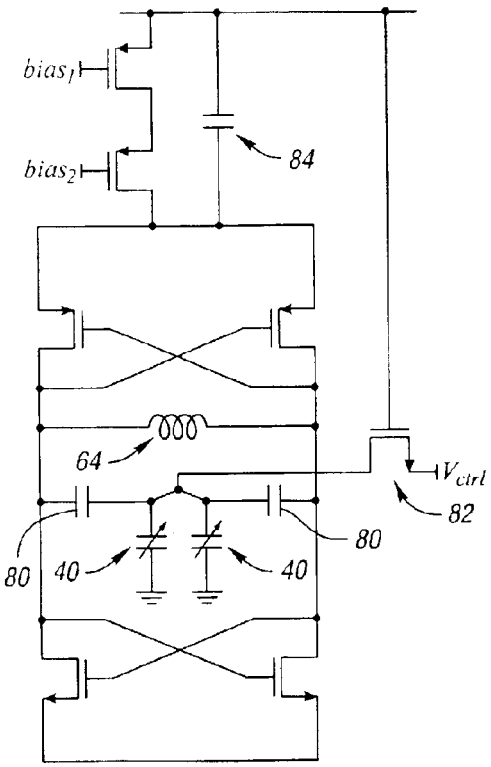
FIG. 7a is a circuit schematic of an oscillator core of a first embodiment of the present invention.
Figure 8A:
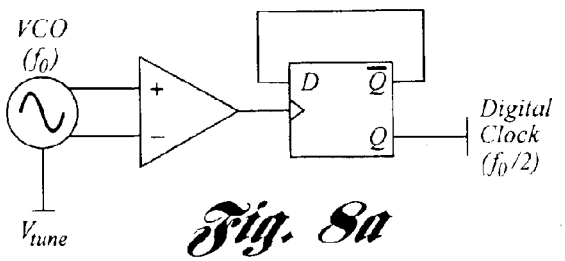
FIG. 8a is a circuit schematic of an oscillator architecture of a first embodiment of the present invention.

The oscillator core topology of FIG. 7a has the following features. First, this topology is well known to provide flicker noise mitigation in CMOS devices—a major source of phase noise due to upconversion around the oscillation frequency. This is accomplished by nature of the doubly-balanced structure as shown. This structure has both top-bottom and left-right symmetry. The tail current source is the primary source of flicker noise. Therefore, the circuit is implemented as a cascoded current source to minimize noise injection from the common mode point by increasing the common mode rejection ratio.

It has also been shown in previous work that through the use of a common mode capacitor 84, the flicker noise injection can be reduced. Additionally, the tail current is sourced through pMOS devices, which are known to exhibit significantly less flicker noise than equivalent nMOS devices in typical CMOS technology. Also, the transconductance of a complementary structure such as this one is twice as high as an all-nMOS or all-pMOS rendition. The higher transconductance permits start-up at lower power. Lastly, this configuration is compatible with the previously described micromachined LC-tank apparatus.

Some key features pertaining to this topology in relation to the LC-tank apparatus are the use of bypass capacitors 80 and a MOS resistor 82 through which a tuning, control input voltage is applied. The bypass capacitors 80 block the DC tuning voltage on the top plates 42 of a pair of parallel varactors 40. The MOS resistor 82 is a high impedance device that permits application of the tuning voltage to the varactors 40. Without such a device, the inductor 64 would resonate with the bypass capacitors 80. Lastly, the cross-coupled devices are biased at or near the weak inversion regime to maximize the gain and minimize the power consumption and noise contribution from the active devices. Below is a summary of the combined features for this topology:

Doubly-balanced structure for symmetry and flicker noise mitigation and low power start-up;

Cascoded tail current for flicker noise rejection;

Common mode capacitor 84 for flicker noise rejection;

pMOS tail current to minimize flicker noise injection;

Compatibility with MEMS LC-tank; and

Active devices at or near weak inversion for power and noise minimization.

Figure 7B:
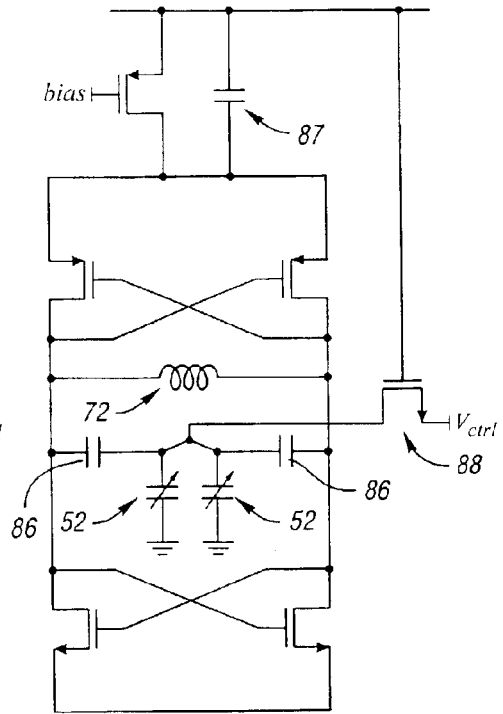
FIG. 7b is a circuit schematic of an oscillator core of a second embodiment of the present invention.

FIG. 7b illustrates a doubly-balanced, cross-coupled, negative resistance CMOS MEMS-LC oscillator with flicker noise reduction of a second embodiment of the present invention. The topology of FIG. 7b presents a negative resistance of $-2/g_m$ to the previously described tank circuit of the second embodiment and thus cancels the loss in the tank. The oscillator includes a pair of the varactors 52, the inductor 72, a MOS resistor 88 and a common mode capacitor 84, much like the embodiment of FIG. 7a. Bypass capacitors 86 isolate the varactor tuning voltage from the remainder of the circuit. The design has been completed to realize a loop gain of at least 5 at a phase shift of 0 degrees in order to satisfy the Barkhaussen start-up criterion with adequate margin. As will be appreciated, the circuit of FIG. 7b can be built with a variety of differing parameters.

As previously discussed, the phase noise density can be reduced by not only an increase in Q, but also a decrease in the circuit noise factor, F. The most significant contribution to phase noise and jitter in CMOS electronics is device flicker noise. Specifically, low frequency device flicker noise from the bias current source is modulated and upconverted around the oscillator fundamental frequency. Improvement techniques reduce the flicker noise upconversion from this source and effectively improve the oscillator noise factor. In particular, both the topology and the bias point were considered in an effort to reduce the noise factor of the circuit. The considerations employed include the following.

Symmetric Topology

A doubly-balanced configuration was selected to promote waveform symmetry in the output signal, thus reducing the likelihood that the rising and falling edges are dissimilar. It has been shown that waveform symmetry can attenuate flicker noise upconversion from the tail current source.

Stabilized Common Mode Point Topology

It has been shown that stabilization of the common mode point can reduce flicker noise injection into the tank. Bypass capacitors 86 are coupled across the tail current device in order to stabilize the common mode point.

Optimum Bias

The quiescent current was set to allow the tank to maintain voltages on the edge of the current-limited regime. In this regime, as opposed to the voltage-limited regime, flicker noise upconversion is reduced.

PMOS Bias

PMOS devices typically exhibit a flicker noise density that is 10 dB less than equally sized NMOS devices. This can be attributed to the buried channel operation of PMOS devices in typical CMOS processes.

Weak Inversion

Previous work shows that flicker noise is reduced in weak inversion. By biasing the tail current source in weak inversion, this effect can improve phase noise performance.

Figure 7C:
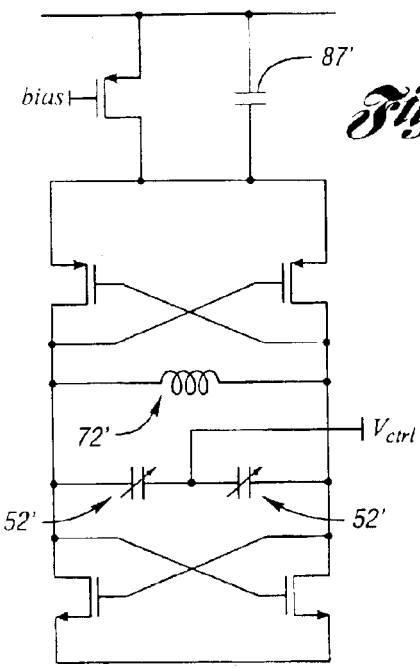
FIG. 7c is a circuit schematic of an oscillator core of a third embodiment of the present invention.

FIG. 7c illustrates a third embodiment of the present invention. Here the blocking capacitors of the embodiment of FIGS. 7a and 7b are not needed as the tuning voltage for the MEMS varactor (i.e. 52') is applied to a common node that is isolated from the sustaining circuit by the MEMS varactor structures. The oscillator includes an inductor 72' and a common mode capacitor 87'. As indicated by the prime designation, the varactors 52', the inductor 72' and the capacitor 87' have the same or similar structure as the varactors 52, the inductor 72 and the capacitor 87 of FIG. 7b.

The oscillator core of FIG. 8a generates a differential sinusoidal signal, which is tapped across the tank. In order to convert this signal into a clock, or square-wave digital signal, the differential signal is converted to a single-ended signal, as shown in FIG. 8a. This signal then clocks a D-flip-flop that has its complementary output tied back to the D input. From here, the clock can be divided arbitrarily to achieve any output frequency. This is a benefit associated with this invention since dividing the clock improves the phase noise performance. To clarify this significance, the high performance oscillator has been designed at a relatively high frequency and its phase noise performance improves each time it is divided. This is in direct contrast to recent trends in the field where a high performance clock is developed at a very low frequency and its phase noise performance is degraded by multiplying up to the operation frequency. There is a substantial systemic advantage in terms of frequency stability in the previous approach. Phase and frequency and related by a linear operator and specifically frequency is the time differential of phase as given by the following:

$$\omega = \frac{d\phi}{dt}$$

where $\omega$ is the radian resonant frequency, $\phi$ is phase and t is time. Consider the ideal voltage output, $v_o(t)$, of an autonomous oscillator as a function of time, t. This signal can be expressed mathematically as follows:

$$v_o(t) = V_o \cos(\omega t)$$

where $\omega$ is the fundamental radian frequency, and $V_o$ is the nominal voltage amplitude. The output of the same oscillator under the influence of noise sources can then be described by:

$$v_o(t) = V_o \cos(\omega t + \phi(t))$$

where $\phi(t)$ is, in general, zero-mean stochastic processes. $\phi(t)$ represents the phase noise of the oscillator. If this signal is divided in frequency by an integer, N, then the signal becomes, $$v_o(t) = V_o \cos\left(\frac{\omega t}{N} + \frac{\phi(t)}{N}\right)$$

where, using the narrowband FM approximation, the phase noise power is decreased by $N^2$. In contrast, the if the oscillator output signal is multiplied by an integer N then the output signal is described by:

$$v_o(t) = V_o \cos(N\omega t + N\phi(t))$$

and the phase noise power is increased by $N^2$. Clearly the invented approach provides substantial reductions in accumulated phase noise, thus enhancing the frequency stability. Lastly, the Q output of the flip-flop is then buffered and the clock drives some arbitrary load.

The complete clock reference circuit of the second embodiment is illustrated in FIG. 8b. The clock oscillator provides a differential output signal that drives a single-ended to differential converting amplifier with unity gain. A series of flip-flops then divide the signal to the appropriate frequency. Table VI provides a summary of performance parameters for the circuit of FIG. 8b.

TABLE VI

Summary of Performance Parameters for the Low-Jitter Monolithic CMOS-MEMS Clock Reference

| Performance Parameter | Value |
|---|---|
| Process Technology | TSMC 0.18 µm mixed-mode |
| Power Supply Rail ($V_{DD}$) | 1.8 V |
| Power Dissipation (Min/Max) | 3.8 mW/4.1 mW |
| Voltage Output Level (High/Low) | 1.8 V/0 V |
| 10%–90% Voltage Rise/Fall Time | 69 ps/48 ps |
| Duty Cycle (High/Low) | 44/56 |
| Period Jitter (1 GHz) | 8.5 fs |
| Phase Noise Density (1 GHz at 600 kHz Offset) | −130 dBc/Hz |
| Discrete Tuning Range (By 2) | 125 MHz–1 Ghz |
| Continuous Tuning Range | 0.15% |

The micromechanical LC components of the second embodiment required modifications to the standard MiM capacitor and inductor. The varactor 52 required the addition of the mechanical support network 58 as well as inclusion of etch holes in the top plate 54 to facilitate release of the structure. Passivation cuts were made around both devices. This manufacturing technique allows for a maskless post-process where the structure can be released completely by a simple wet etch chemistry if required. The structure is, however, almost completely released from the passivation cuts that are made as part of the standard CMOS process.

The fabrication technology developed may include the following steps, as described with reference to FIGS. 9a–9d. In each of the FIGS. 9a–9d, there are illustrated in phantom dielectric layers 91, 92, 93 and 94. Also illustrated are metal layers 95, 96 and 97. Vias such as vias 98 interconnect the metal layers 95, 96 and 97. Also shown are a suspended section 100 and an anchored section 99 of a MEMS device formed on a substrate 90. Active CMOS devices 102 are also formed on the substrate 90.

First, the MEMS varactor (40 or 52 in FIGS. 4a and 4b) and MEMS inductor (64 or 72 in FIGS. 5a and 5b) are defined by either the MiM layers or two level metal routing layers and the vias that interconnect these layers in a standard CMOS process, shown in completion in FIG. 9a for a process with three metal interconnect layers 95, 96 and 97. Therefore, no additional masks are required to define the structures.

Figure 9B:
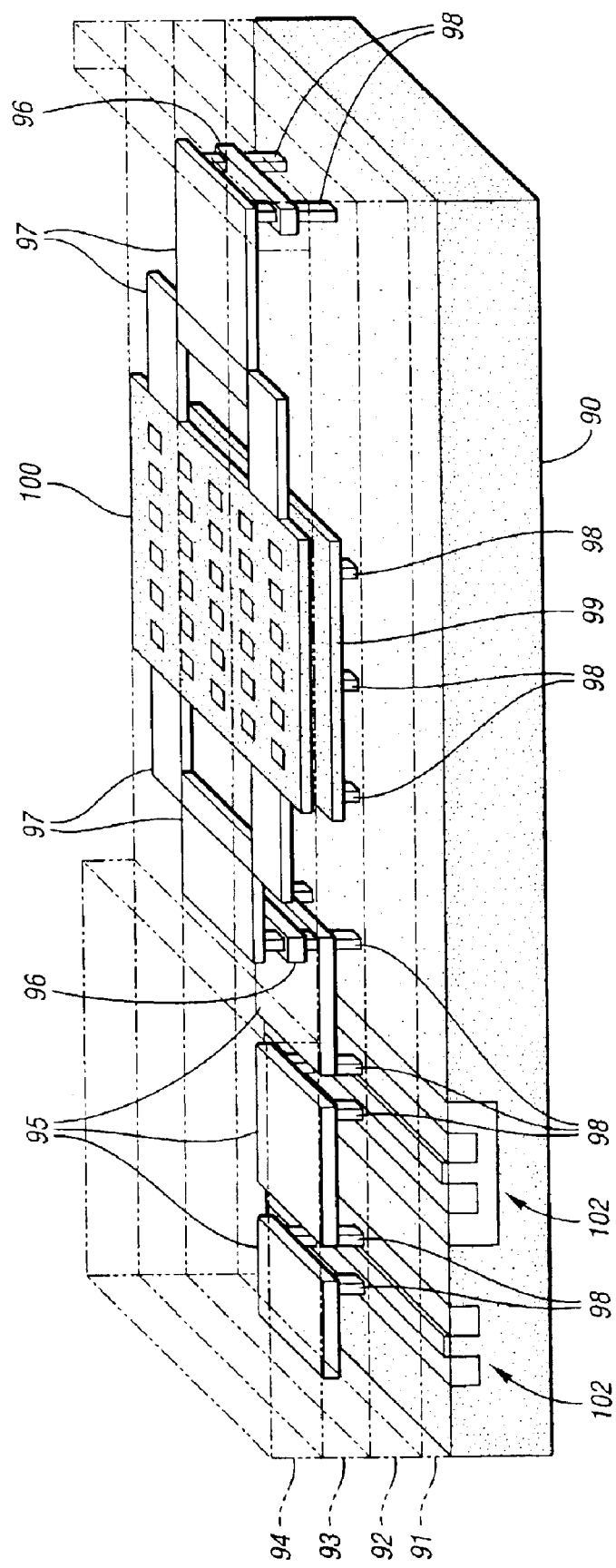

As shown in FIG. 9b, the MEMS devices will be exposed from a standard CMOS bond pad cut. The first and optional mask (optional if a high resistivity SOI substrate is used as described previously or if the substrate is a bulk substrate) is for etching the Si substrate (48 or 68 in FIGS. 4a and 5a) from the backside and stopping on the BOX (50 or 70 in FIGS. 4a and 5a) around each device.

Figure 9C:
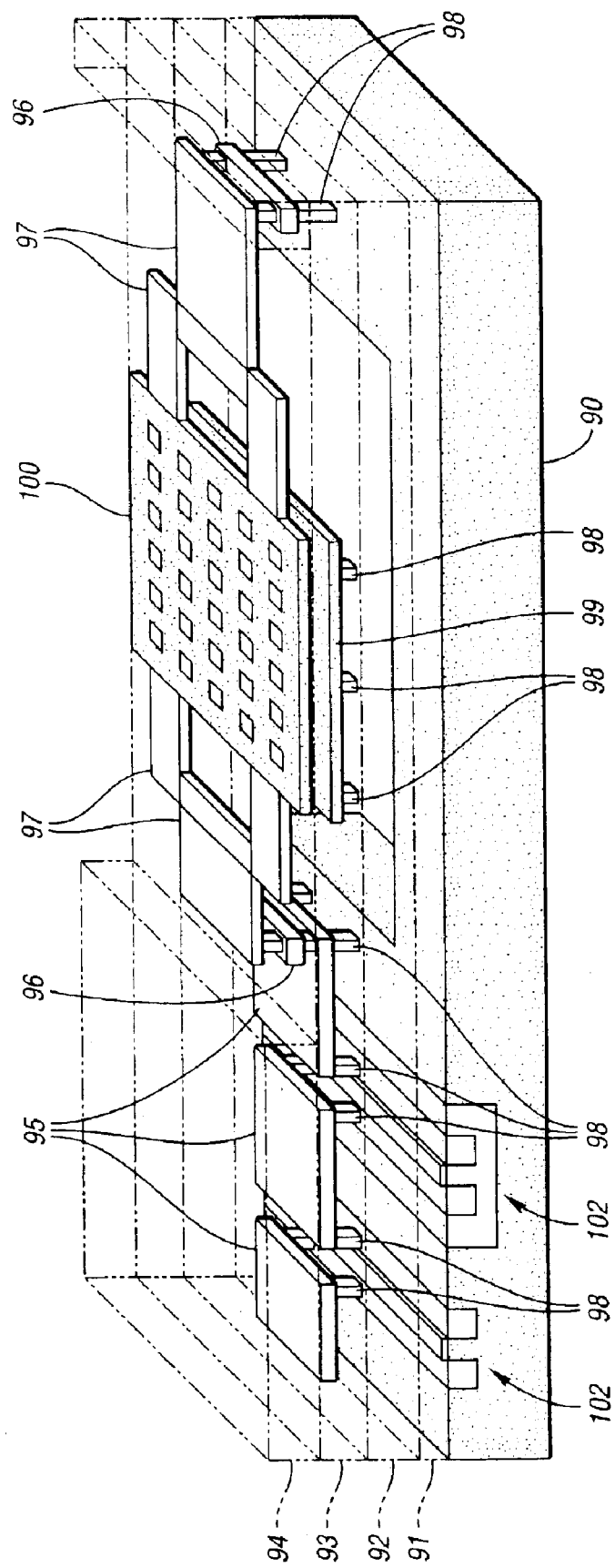
Figure 9B:
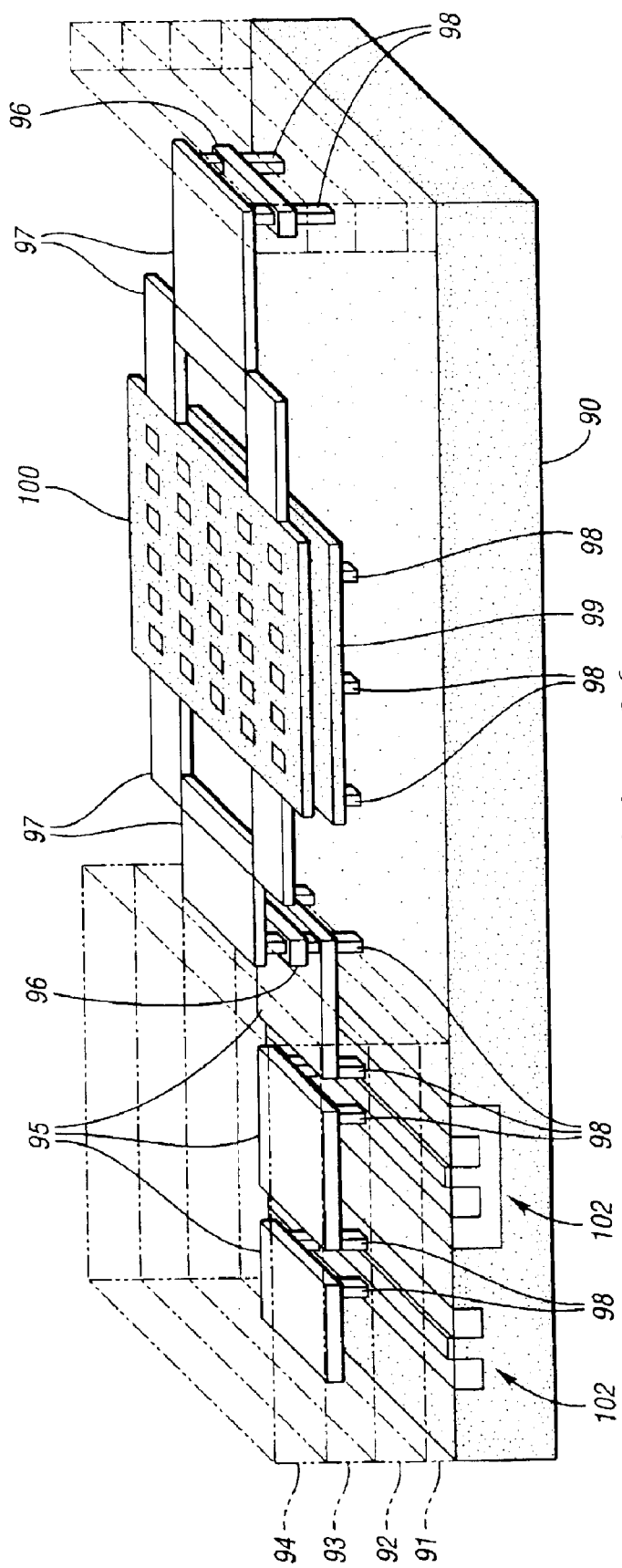

The removed substrate is shown in FIG. 9c. Last, the insulating dielectric material around the varactor (40 or 52 in FIGS. 4a and 4b) and the inductor (64 or 72 in FIGS. 5a and 5b) may be removed if the bond pad cut did not release the devices. This step, illustrated in FIG. 9d, releases the varactor plates (42 and 44 in FIG. 4a or 54 and 56 in FIG. 4c) and suspend the inductor (64 or 72 in FIGS. 5a and 5b).

The key concepts addressed in the fabrication process are summarized below:

Structural metal defined in standard bulk or SOI CMOS process;

Release etch as post-process; and

Optional backside etch as post-process.

The abbreviated fabrication flow diagram is shown in FIGS. 9a–9d, which are referenced by etch chemistries tabulated in Table VII.

TABLE VII

Fabrication Process Flow

| Drawing Step | Layer | Process | Mask | Details |
|---|---|---|---|---|
| FIG. 9a | MiM or Routing | Deposit | — | Standard CMOS |
| FIG. 9b | Dielectric | Etch | — | Standard CMOS |
| FIG. 9c | Si-Handle | Etch | H1 | $SF_6$, $C_4F_8$, DRIE |
| FIG. 9d | Dielectric | Etch | — | $HF/H_2SO_4$, $H_2O_2$, $H_2O$, wet |
| FIG. (not shown) | — | Dry | — | Supercritical $CO_2$ |

Complete Monolithic Oscillators

The resulting clock generation circuits provide a time base which has low phase noise and low power, is tunable, and provides a digital clock output. They are suitable for a myriad of applications including, but not limited to, clocks for embedded microcontrollers and microprocessors.

In summary, the present invention provides a number of unique benefits including, but not limited to, the following:

A highly stable monolithic CMOS clock generator circuit requiring no external components realized with a high-Q MEMS LC-tank;

Standard commercial CMOS-compatible MEMS LC-tank realized by utilizing standard CMOS process layers and a maskless release post-process;

Oscillator circuit topology for improved frequency stability through reduction in flicker noise upconversion;

Top-down frequency generation that offers comparable stability to bottom-up frequency generation;

Significant reduction in cost for clock generation;

Significant reduction in power for clock generation;

Reduced pin count and thus reduced packaging costs for microcontrollers and microprocessors;

Significant reduction in overall size and embedded system since clock generation is on-chip and not a discrete component in a separate package;

Increased reliability due to monolithic integration and not board level integration; and Wide tuning range (continuous and discrete).

Figure 10:
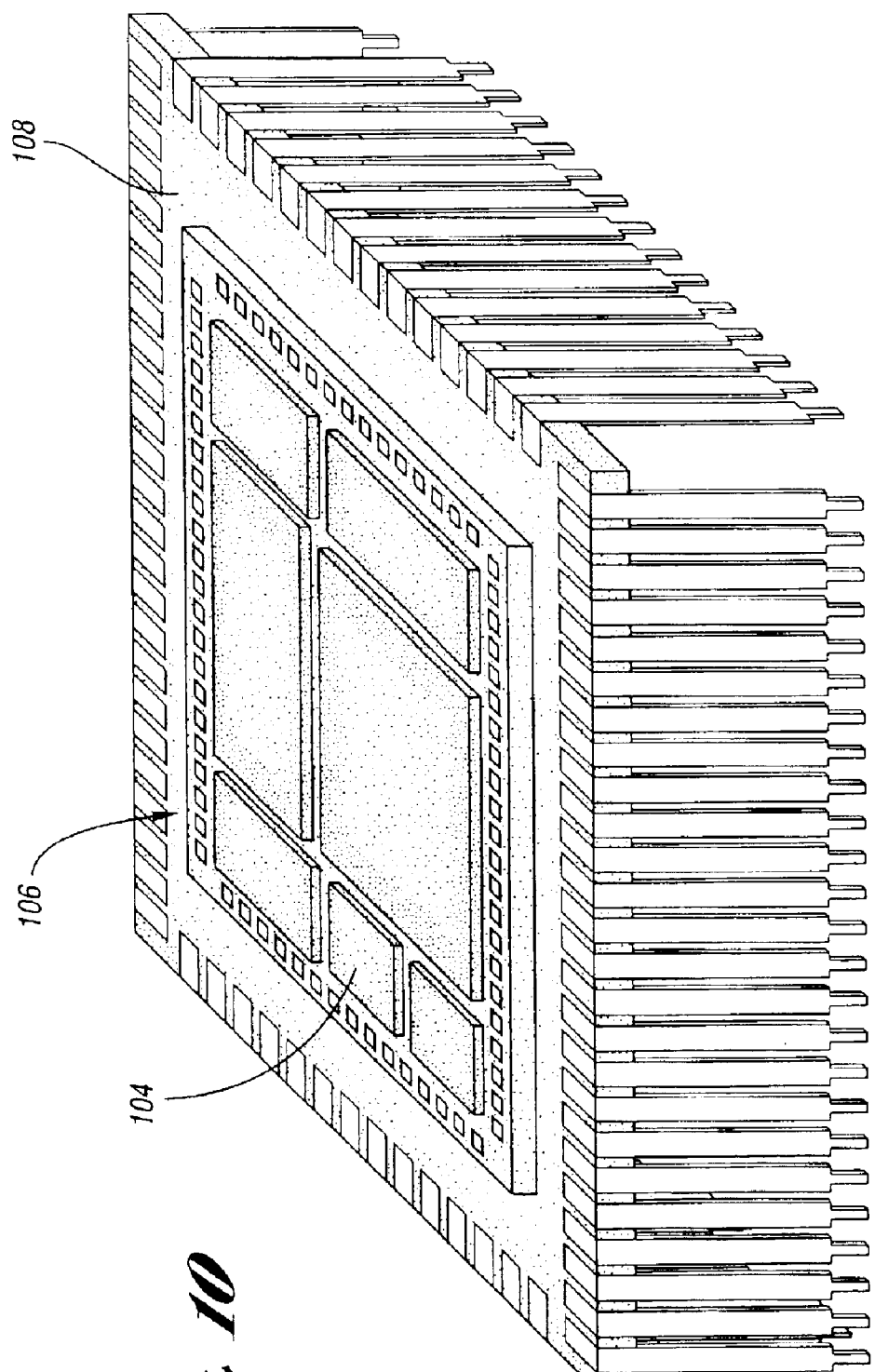
FIG. 10 is a perspective schematic view of a synchronous semiconductor device of the present invention on a single substrate containing a variety of electronic subsystems together with a package for the device.

With the present invention, clock generation circuitry, or time base, may be integrated on-chip. In all synchronous integrated circuit applications, such a signal is required. Incorporation of the present invention into an integrated circuit application is illustrated in FIG. 10. A clock generator 104 is formed as part of an integrated circuit such as a microprocessor, microcontroller, or other synchronous device 106. The synchronous semiconductor device 106 is formed on a substrate containing a variety of electronic subsystems. A package 108 is provided for the semiconductor device 106. In other words, the clock generation circuitry may become a monolithic component of the complete integrated circuit and it can be manufactured with the electronics it supports on a common substrate.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

For example, the above discussion focused heavily on the monolithic aspect of the present invention. Those skilled in the art will readily recognize that many advantages of the present invention, e.g., the construction of MEMS-based devices with standard CMOS processes, are realized without the requirement that the present invention be monolithic.

Additionally, the present invention has a wide variety of uses in specific applications such as PDAs, cellular telephones, portable computers, desktop computers, etc.

What is claimed is:

1. A MEMS-based, clock generation circuit, the circuit comprising:

a substrate;

a voltage-control led oscillator fabricated on the substrate and including a MEMS LC-tank apparatus for generating a differential sinusoidal periodic signal, the LC-tank apparatus comprising a parallel plate capacitor and an inductor fabricated in a plurality of CMOS metal interconnect layers, the parallel plate capacitor comprising a top plate suspended in air over the substrate and moveable in response to a control voltage, and the inductor supported in air over the substrate; and first circuitry also fabricated on the substrate for converting the differential sinusoidal periodic signal into a single-ended, high frequency, square-wave digital output signal.

2. The clock generation circuit as claimed in claim 1 wherein the differential sinusoidal periodic signal has an original frequency, wherein the square-wave digital output signal has a frequency of half of the original frequency, and wherein the circuit further comprises second circuitry also fabricated on the substrate for dividing the frequency of the square-wave digital output signal to at least one lower desired application frequency.

3. The clock generation circuit as claimed in claim 2 wherein the first and second circuitry and the voltage-controlled oscillator are fabricated on the substrate with a CMOS-compatible process.

4. The clock generation circuit as claimed in claim 1 wherein both the voltage-controlled oscillator and the first circuitry are fabricated on the substrate with a CMOS-compatible process.

5. The clock generation circuit as claimed in claim 4 wherein the CMOS-compatible process is a bulk or SOI CMOS process.

6. The clock generation circuit as claimed in claim 1 wherein the first circuitry also converts the differential sinusoidal periodic signal into the single-ended square-wave digital output signal at half of the original frequency.

7. The clock generation circuit as claimed in claim 2 wherein the second circuitry includes at least one flip-flop coupled to the first circuitry for dividing the frequency of the square-wave digital output signal to the at least one lower desired application frequency.

8. The clock generation circuit as claimed in claim 1 wherein the substrate is a bulk or SOI substrate.

9. A MEMS-based oscillator circuit comprising:

a substrate;

a MEMS LC-tank apparatus fabricated on the substrate with a CMOS-compatible process;

first circuitry fabricated on the substrate with the CMOS-compatible process and coupled to the LC-tank apparatus to generate a sinusoidal periodic signal having an original frequency; and second circuitry fabricated on the substrate with the CMOS-compatible process and coupled to the first circuitry to convert the sinusoidal periodic signal to a plurality of square-wave periodic signals having a corresponding plurality of application frequencies, each application frequency of the plurality of application frequencies equal to the original frequency divided by an integer.

10. The oscillator circuit as claimed in claim 9 wherein the oscillator circuit is tunable in response to a control input to provide a variable original frequency.

11. The oscillator circuit as claimed in claim 9 wherein the CMOS-compatible process is a bulk or SOI CMOS process.

12. The oscillator circuit as claimed in claim 9 wherein the oscillator circuit is a double-balanced oscillator circuit to reduce flicker noise upconversion.

13. The oscillator circuit as claimed in claim 10 wherein the LC-tank includes at least one micromachined varactor having a capacitance which varies in response to the control input.

14. The oscillator circuit as claimed in claim 13 wherein the at least one varactor includes a top plate and wherein the circuitry includes bypass capacitors to block the control input to the top plate from the remainder of the circuitry.

15. The oscillator circuit as claimed in claim 13 wherein the oscillator circuit is a double-balanced, cross-coupled oscillator circuit to reduce flicker noise upconversion.

16. A MEMS-based, LC-tank apparatus having a high quality factor, the apparatus comprising:
a substrate;
at least one micromachined, parallel plate varactor fabricated on the substrate with a CMOS-compatible process in conductive layers;
a micromachined inductor coupled to the at least one varactor and also fabricated on the substrate with the CMOS-compatible process in a conductive layer of the conductive layers;
wherein the varactor has a first predetermined size and the inductor has a second predetermined size to generate a stable sinusoidal signal having a high original frequency during oscillation; and
circuitry coupled to the varactor and the inductor to divide the high original frequency, by a factor of two, to a lower application frequency.

17. The apparatus as claimed in claim 16 wherein the at least one varactor has a variable capacitance to provide a tuning range for the apparatus.

18. The apparatus as claimed in claim 16 wherein the inductor is suspended above the substrate and released during or upon completion of the CMOS-compatible process.

19. The apparatus as claimed in claim 16 wherein the inductor is hollow.

20. The apparatus as claimed in claim 16 wherein the inductor is suspended above the substrate by anchors that are defined by the CMOS-compatible process.

21. The apparatus as claimed in claim 17 wherein the at least one varactor has a fixed bottom plate and a movable top plate suspended above the bottom plate and released during or upon completion of the CMOS-compatible process.

22. The apparatus as claimed in claim 21 wherein the top plate deflects based on a control input to tune the capacitance of the at least one varactor.

23. The apparatus as claimed in claim 21 wherein the top plate is suspended above the bottom plate by a mechanical suspension network defined by the CMOS-compatible process.

24. The apparatus as claimed in claim 16 wherein the plurality of conductive layers are metal layers.

25. The apparatus as claimed in claim 16 wherein the CMOS-compatible process is a bulk or SOI CMOS process.

26. The apparatus as claimed in claim 12 wherein the top plate has a plurality of etch holes to facilitate release of the top plate during or upon completion of the CMOS-compatible process.

27. The apparatus as claimed in claim 16 wherein the substrate is a bulk or SOI substrate.

28. The apparatus as claimed in claim 16 wherein the original frequency during oscillation is a resonant frequency.

29. The apparatus as claimed in claim 16 wherein the at least one varactor and the inductor are defined by one or more of the following: metal-insulator-metal (MiM) layers or metal routing layers.

30. A computer system comprising:
a databus;
a central processing unit coupled bi-directionally to the databus;
transient memory coupled bi-directionally to the databus;
persistent memory coupled bi-directionally to the databus; and
a clock generation circuit for generating a stable, square-wave digital output signal suitable for use within said computer system, the clock generation circuit comprising:
an oscillator fabricated on a substrate and including a EMS-based, LC-tank apparatus for generating a sinusoidal periodic signal having a first frequency; and
first circuitry fabricated on the substrate for converting the sinusoidal periodic signal into a plurality of high frequency square-wave digital output signals each having a second frequency, the second frequency equal to the first frequency divided by an integer.

31. A clock generation circuit, the circuit comprising:
a substrate;
a MEMS-based, LC-tank oscillator fabricated on the substrate for generating a periodic sinusoidal signal having an original frequency;
first circuitry fabricated on the substrate for converting the periodic signal into a high frequency, square-wave digital output signal having a frequency of half of the original frequency; and
second circuitry fabricated on the substrate for dividing the frequency of the square-wave digital output signal to at least one lower application frequency.

32. The clock generation circuit as claimed in claim 31 wherein the sinusoidal periodic signal is a differential signal and wherein the first circuitry converts the sinusoidal differential signal into a sinusoidal single-ended signal.

33. The clock generation circuit as claimed in claim 32 wherein the first circuitry also converts the sinusoidal single-ended signal into the square-wave digital output signal at half of the original frequency.

34. The clock generation circuit as claimed in claim 31 wherein the second circuitry includes at least one flip-flop coupled to the first circuitry for dividing the frequency of the square-wave digital output signal to the at least one lower application frequency.

35. A MEMS-based, oscillator circuit for generating a low noise, high frequency, periodic signal, the oscillator circuit comprising:
a substrate;
a high-Q MEMS LC-tank apparatus fabricated on the substrate with a CMOS-compatible process, the LC-tank comprising at least one micromachined varactor having a capacitance which varies in response to the control input and having a top plate; and circuitry fabricated on the substrate with the CMOS-compatible process and coupled to the LC-tank apparatus to generate the periodic signal and including a bypass capacitor to block the control input to the top plate from the remainder of the circuitry.

36. A MEMS-based, LC-tank apparatus having a high quality factor, the apparatus comprising:

a substrate;

at least one micromachined varactor fabricated on the substrate with a CMOS-compatible process, the at least one micromachined varactor having a variable capacitance to provide a tuning range for the apparatus, the at least one micromachined varactor comprising a fixed bottom plate and a movable top plate suspended above the bottom plate, wherein the top plate has a plurality of etch holes to facilitate release of the top plate during or upon completion of the CMOS-compatible process; and a micromachined inductor coupled to the at least one varactor and fabricated on the substrate with the CMOS-compatible process.

37. An integrated clock generation circuit, comprising:

a MEMS-based, LC tank oscillator circuit fabricated on a substrate for generating a first, differential periodic signal having a first frequency, the oscillator circuit comprising an inductor coupled to a capacitor; and a frequency divider circuit fabricated on the substrate and coupled to the oscillator circuit to convert the first, differential periodic signal to a plurality of single-ended square-wave periodic application signals, each periodic application signal having a different frequency equal to an integer fraction of the first frequency.

38. The integrated clock generation circuit of claim 37, wherein a clock signal is a selected periodic application signal of the plurality of square-wave periodic application signals.

39. The integrated clock generation circuit of claim 37, wherein the oscillator circuit further comprises active devices adapted to operate at or near weak inversion.

40. The integrated clock generation circuit of claim 37, wherein the frequency divider circuit comprises:

a plurality of flip-flops coupled in succession, a clock input of a first flip-flop of the plurality coupled to the oscillator circuit to receive the first, differential periodic signal, and the output of each flip-flop providing a corresponding periodic application signal.

41. The integrated clock generation circuit of claim 37, wherein the inductor and capacitor are MEMS-based.

42. The integrated clock generation circuit of claim 37, wherein the inductor and capacitor are fabricated from one or more CMOS-compatible layers.

43. The integrated clock generation circuit of claim 42, wherein the one or more CMOS-compatible layers are one or more metal layers.

44. The integrated clock generation circuit of claim 43, wherein the inductor is supported in air over the substrate and the capacitor is suspended in air over the substrate.

45. The integrated clock generation circuit of claim 44, wherein the inductor and capacitor, following CMOS fabrication defining bond pad openings, are released in a maskless etch process.

46. The integrated clock generation circuit of claim 37, wherein the capacitor is metal-insulator-metal (MiM).

47. The integrated clock generation circuit of claim 37, wherein the capacitor is formed of CMOS-compatible metal routing layers.

48. The integrated clock generation circuit of claim 37, further comprising:

a microprocessor.

49. The integrated clock generation circuit of claim 37, further comprising:

a microcontroller.

50. The integrated clock generation circuit of claim 37, wherein phase noise decreases with each successive frequency division performed by the frequency divider.

51. The integrated clock generation circuit of claim 37, wherein periodic application signal stability improves with each successive frequency division performed by the frequency divider.

52. An integrated clock generation circuit, comprising:

an oscillator circuit fabricated on a substrate for generating a first, differential periodic signal having a first frequency, the oscillator circuit comprising an inductor coupled to a capacitor;

an amplifier fabricated on the substrate and coupled to the oscillator to convert the first, differential periodic signal to a single-ended signal having a second frequency; and a frequency divider circuit fabricated on the substrate and coupled to the amplifier to convert the single-ended signal to a plurality of square-wave periodic application signals, each periodic application signal having a different frequency equal to the second frequency divided by an integer.

53. The integrated clock generation circuit of claim 52, wherein a clock signal is a selected periodic application signal of the plurality of square-wave periodic application signals.

54. The integrated clock generation circuit of claim 52, wherein the second frequency is equal to the first frequency.

55. The integrated clock generation circuit of claim 52, wherein the frequency divider circuit comprises:

a plurality of flip-flops coupled in succession, a clock input of a first flip-flop of the plurality coupled to the amplifier to receive the single-ended signal, and the output of each flip-flop providing a corresponding periodic application signal.

56. The integrated clock generation circuit of claim 52, wherein the inductor and capacitor are MEMS-based.

57. The integrated clock generation circuit of claim 52, wherein the inductor and capacitor are fabricated from one or more CMOS-compatible metal layers.

58. The integrated clock generation circuit of claim 57, wherein the inductor is supported in air over the substrate and the capacitor is suspended in air over the substrate.

59. The integrated clock generation circuit of claim 58, wherein the inductor and capacitor, following CMOS fabrication defining bond pad openings, are released in a maskless etch process.

60. The integrated clock generation circuit of claim 52, wherein the capacitor is metal-insulator-metal.

61. An integrated clock generation circuit, comprising:

a double-balanced LC-tank oscillator circuit fabricated from a CMOS-compatible process on a substrate, the LC-tank oscillator circuit for generating a stable differential periodic signal having a first frequency, the LC-tank oscillator circuit comprising an inductor and a capacitor fabricated from one or more CMOS-compatible layers;

an amplifier fabricated from a CMOS-compatible process on the substrate and coupled to the L-C tank oscillator circuit to convert the differential periodic signal to a single-ended signal having a second frequency; and a frequency divider circuit fabricated on the substrate and coupled to the amplifier to convert the single-ended signal to a plurality of square-wave periodic application signals, each periodic application signal having a different frequency equal to the second frequency divided by an integer, wherein a periodic application signal of the plurality of square-wave periodic application signals is a clock signal.

* * * * *

UNITED STATES PATENT AND TRADEMARK OFFICE
CERTIFICATE OF CORRECTION

PATENT NO. : 6,972,635 B2
DATED : December 6, 2005
INVENTOR(S) : Michael S. McCorquodale et al.

It is certified that error appears in the above-identified patent and that said Letters Patent is hereby corrected as shown below:

Column 26,
Line 5, delete "12" and insert -- 21 --.

Column 26,
Line 29, delete "EMS" and insert -- MEMS --.

Signed and Sealed this

Twenty-fifth Day of April, 2006

JON W. DUDAS
*Director of the United States Patent and Trademark Office*